(12) United States Patent
Barth et al.

(10) Patent No.: US 9,793,220 B2
(45) Date of Patent: Oct. 17, 2017

(54) DETECTION OF ENVIRONMENTAL CONDITIONS IN A SEMICONDUCTOR CHIP

(71) Applicants: Hans-Joachim Barth, Munich (DE); Horst Baumeister, Munich (DE); Peter Baumgartner, Munich (DE); Philipp Riess, Munich (DE); Jesenka Veledar Krueger, Ottobrunn (DE)

(72) Inventors: Hans-Joachim Barth, Munich (DE); Horst Baumeister, Munich (DE); Peter Baumgartner, Munich (DE); Philipp Riess, Munich (DE); Jesenka Veledar Krueger, Ottobrunn (DE)

(73) Assignee: INTEL DEUTSCHLAND GMBH, Neubiberg (DE)

( * ) Notice: Subject to any disclaimer, the term of this patent is extended or adjusted under 35 U.S.C. 154(b) by 1214 days.

(21) Appl. No.: 13/729,145

(22) Filed: Dec. 28, 2012

(65) Prior Publication Data
US 2013/0240884 A1    Sep. 19, 2013

Related U.S. Application Data

(60) Provisional application No. 61/611,755, filed on Mar. 16, 2012.

(51) Int. Cl.
*G01R 31/3187* (2006.01)
*G01R 31/26* (2014.01)
(Continued)

(52) U.S. Cl.
CPC .......... *H01L 23/544* (2013.01); *H01L 23/562* (2013.01); *H01L 23/642* (2013.01); *H01L 27/04* (2013.01); *H01L 2224/16225* (2013.01)

(58) Field of Classification Search
CPC ............ G01R 31/2853; G01R 31/2831; G01N 29/14; G01N 29/223; H01L 23/544; H01L 23/642; H01L 23/562; H01L 27/04
See application file for complete search history.

(56) References Cited

U.S. PATENT DOCUMENTS 5,602,487 A     2/1997  Manku
6,104,056 A *   8/2000  Yano ...................... B82Y 10/00
                                                       257/314
(Continued)

FOREIGN PATENT DOCUMENTS

CN      1421703 A    6/2003
CN      1462068 A   12/2003
(Continued)

OTHER PUBLICATIONS

Office Action received for German Patent Application No. 10 2013 102 557.9, dated Jul. 26, 2013, 5 pages of Office Action including 2 pages of English Translation.
(Continued)

*Primary Examiner* — Minh N Tang
(74) *Attorney, Agent, or Firm* — Viering, Jentschura & Partner mbB

(57) ABSTRACT

A capacitive sensor and measurement circuitry is described that may be able to reproducibly measure miniscule capacitances and variations thereof. The capacitance may vary depending upon local environmental conditions such as mechanical stress (e.g., warpage or shear stress), mechanical pressure, temperature, and/or humidity. It may be desirable to provide a capacitor integrated into a semiconductor chip that is sufficiently small and sensitive to accurately measure conditions expected to be experienced by a semiconductor chip.

21 Claims, 18 Drawing Sheets

(51) Int. Cl.
  *H01L 23/544* (2006.01)
  *H01L 27/04* (2006.01)
  *H01L 23/00* (2006.01)
  *H01L 23/64* (2006.01)

(56) References Cited

U.S. PATENT DOCUMENTS

| | | |
|---|---|---|
| 6,404,222 B1 | 6/2002 | Fan et al. |
| 6,438,257 B1 | 8/2002 | Morimura et al. |
| 6,501,283 B2 | 12/2002 | Lindolf et al. |
| 6,549,029 B1 | 4/2003 | Hsieh et al. |
| 6,693,441 B2 | 2/2004 | Lane et al. |
| 6,894,520 B2 | 5/2005 | Yamashita et al. |
| 7,091,726 B2 | 8/2006 | Sano et al. |
| 7,098,676 B2 * | 8/2006 | Landers ............... H01L 22/34 257/486 |
| 2001/0033177 A1 | 10/2001 | Lindolf et al. |
| 2003/0062905 A1 | 4/2003 | Kollmer et al. |
| 2003/0218473 A1 | 11/2003 | Yamashita et al. |
| 2007/0102787 A1 * | 5/2007 | Goebel ............... H01L 23/5223 257/532 |
| 2009/0160020 A1 * | 6/2009 | Barth ............... H01L 23/5223 257/532 |
| 2012/0084033 A1 | 4/2012 | Liu et al. |

FOREIGN PATENT DOCUMENTS

| | | |
|---|---|---|
| DE | 100 01 129 A1 | 7/2001 |
| DE | 100 10 888 A1 | 9/2001 |
| DE | 100 10 946 A1 | 9/2001 |
| DE | 10010946 C2 | 6/2002 |
| DE | 699 33 339 T2 | 5/2007 |
| TW | 464764 B | 11/2001 |
| TW | I235242 B | 7/2005 |

OTHER PUBLICATIONS

Office action received for CN Patent Application No. 201310082881.1, dated Feb. 13, 2015, 23 pages of office action and 13 pages of English translation.

Office Action received for Taiwanese Patent Application No. 102108460, mailed on May 18, 2015, 6 pages of Office Action and 9 pages of English translation.

* cited by examiner

DETECTION OF ENVIRONMENTAL CONDITIONS IN A SEMICONDUCTOR CHIP

CROSS-REFERENCE TO RELATED APPLICATION

This application claims the benefit of priority of U.S. provisional application No. 61/611,755, filed 16 Mar. 2012, the content of it being hereby incorporated by reference in its entirety for all purposes.

BACKGROUND

Semiconductor chips assembled in advanced packages may be subject to significant mechanical pressure, mechanical stress, humidity, and/or temperature cycling during manufacturing and testing as well as in the end user environment. This may result in chip failures cause by, e.g., cracks and/or delamination in the interconnect levels, the device/transistor level, and/or the chip substrate itself. Chips that use advanced technology nodes, such as those that include Cu/low k interconnects, are even more prone to failure due to the inherent mechanical weakness of dense and porous low k materials.

Some materials such as low k dielectrics are particularly sensitive to the intrusion and diffusion of moisture such as water. Such moisture intrusion may increase the k-value (dielectric constant) due to the high polarity of water molecules, and may result in increasing RC-delays, signal degradation, increasing interconnect capacitive load, parasitic power loss, and/or interconnect corrosion.

For some chips, such as power chips, temperature variations can result in significant warpage of the chips inside their packages, such as by changing from a convex deformation at −55° C. to a concave deformation at +150° C. with center-edge differences of up to approximately 2 μm. This warpage can lead to large intrinsic stress and strain within the chips, which in turn can result in early failure or degradation of the chip.

It has already been proposed that piezo-electric resistors may be embedded in chip substrates to measure stress levels. However, these would likely have only marginal sensitivity to the localized chip/package interaction stresses in the interconnect or back-end-of-line (BEOL) stack (such as in one of the weaker Cu/low k levels). Moreover, such resistors would likely not detect other factors such as mechanical pressure or humidity.

SUMMARY

An innovative capacitive sensor and measurement circuitry is described herein that may be able to reproducibly measure miniscule capacitances and variations thereof. The capacitance may vary depending upon local environmental conditions such as mechanical stress (e.g., warpage or shear stress), mechanical pressure, temperature, and/or humidity. It is already well-known that capacitors, in general, may have capacitances that vary in accordance with such variables. Therefore, it may be desirable to provide a capacitor integrated into a semiconductor chip that is sufficiently small and sensitive to accurately measure conditions expected to be experienced by a semiconductor chip.

The capacitor may be an individual capacitor, or it may be part of a larger plurality (e.g., array) of capacitors in a two-dimensional or three-dimensional distribution through one or more portions of the semiconductor chip. By providing multiple capacitors in a distributed manner, the local conditions within various locations of the chip may also be determined. The one or more capacitors may be placed in certain strategic locations relative to other elements of the chip, such as near a seal ring (moisture barrier) of the chip. Such strategic locating of the capacitors may increase their ability to provide early detection of certain conditions, such as early detection of humidity infiltration past the seal ring.

Because the capacitors may provide extremely small capacitances and variations thereof, special circuitry is described herein that may be capable of more accurately and reliably measuring such miniscule capacitances and variations. Standard capacitance-measuring circuitry may not be sufficient.

The measured capacitances and/or environmental conditions may be used to trigger one or more actions by the chip, such as providing an impending chip failure warning signal to the chip user or surrounding device, providing data predicting when the chip will likely fail, and/or modifying functionality of the chip. Where the surrounding device incorporating the chip receives such signals, the device may be able to respond by taking countermeasures such as increasing cooling of the chip and/or providing an indication to the user of the device. The measured capacitances and/or environmental conditions may further be stored in a memory within the chip to provide a history of those capacitances and/or environmental conditions. The stored history data and/or a trend detected in the stored history data may additionally or alternatively be used to trigger the one or more actions.

While early monitoring and warning of impending chip failure may be useful in any chip application, this may be particularly useful in certain chip applications that call for increased reliability and minimal downtime. Such chip applications may include, but are not limited to, server, automotive, security, and medical applications. However, the concepts described herein may be used for any chips in any chip applications, such as but not limited to microprocessors, microcontrollers, communication chips, memories, and the like.

These and other aspects will be apparent upon consideration of the following detailed description.

BRIEF DESCRIPTION OF THE DRAWINGS

A more complete understanding of the present disclosure and the potential advantages of various aspects described herein may be acquired by referring to the following description in consideration of the accompanying drawings, in which like reference numbers indicate like features, and wherein:

FIGS. 18A-18L are plan views of example configurations of sense capacitors.

It is noted that one or more of the drawings may not necessarily be drawn to scale.

DETAILED DESCRIPTION

Figure 1:
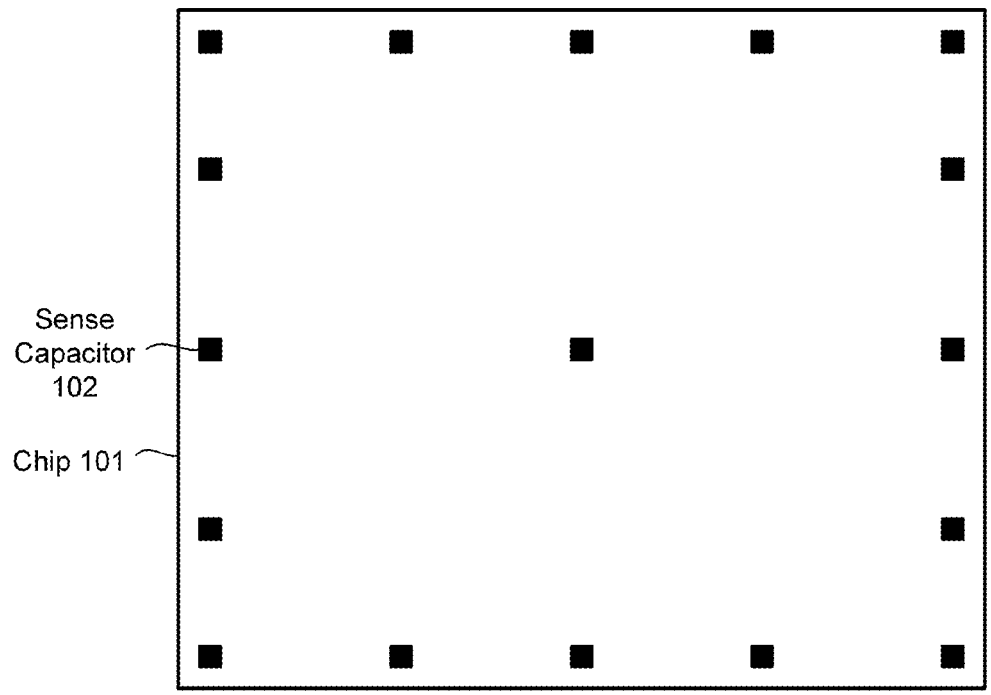
FIG. 1 is a plan view of an example of a semiconductor chip having sense capacitors distributed throughout the chip.

FIG. 1 is a plan view of an example of a semiconductor chip 101 having one or more sense capacitors 102 distributed throughout the chip 101. The chip 101 may also contain other circuitry, such as transistors, capacitors, resistors, inductors, memory cells, clock generators, and the like. The chip 101 may be any type of chip 101 containing circuitry, such as, but not limited to, a microprocessor chip, a memory chip, a communications chip, a digital signal processing (DSP) chip, a power chip, an amplifier chip, a field-programmable gate array (FPGA), a logic chip, etc.

The sense capacitors 102 may be used to detect one or more environmental conditions, such as temperature, humidity, pressure, and/or shear stress. The location of each sense capacitor 102 may be strategically arranged based on the type of environmental conditions that are desired to be sensed. For example, one or more of the sense capacitors 102 may be arranged near the perimeter of the chip 101 to provide early detection of moisture (humidity) entering the chip 101 from the edges of the chip 101. As is well known, diffusion of moisture into a low-k dielectric changes the k value of the dielectric.

Figure 2:
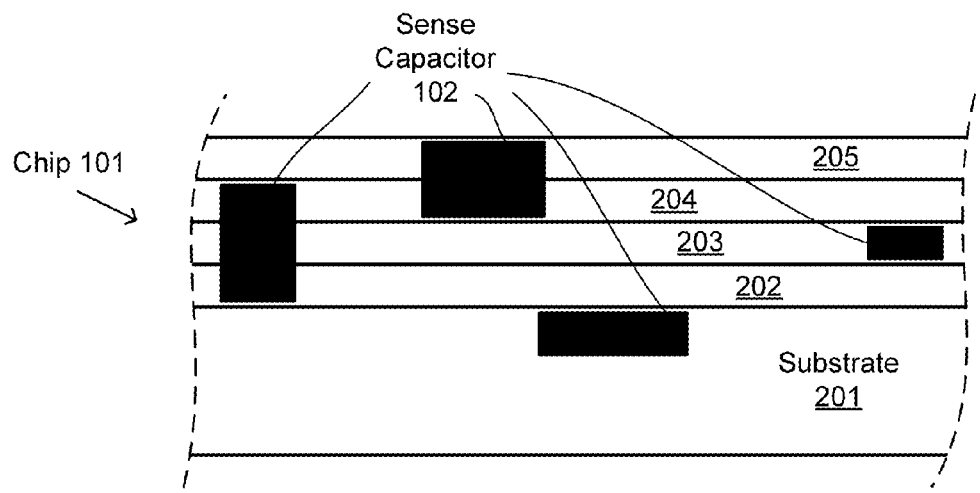
FIG. 2 is a side cutaway view of the semiconductor chip of FIG. 1.

As shown in FIG. 2, the chip 101 may have, for example, a substrate 201 with one or more layers 202, 203, 204, 205 that form the circuitry and structure of the chip 101. The layers 202-205 may be made of various materials, such as conductors (e.g., metals or polysilicon) and insulators/dielectrics (e.g., silicon oxide). The sense capacitors 102 may be arranged in any one or more of the layers 202-205 and/or in the substrate 201, as desired. Thus, for example, a given one of the sense capacitors 102 may be fully disposed within a single one of the layers 201-205 or the substrate 201, while another one of the sense capacitors 102 may extend across two or more of the layers 202-205 and/or the substrate 201. Thus, the sense capacitors 102 may be variously arranged not only at different lateral positions within the chip 101, but also at different vertical positions within the chip 101, as desired. The vertical positioning of a given one of the sense capacitors 102 may also be strategically planned based on the type of environmental conditions desired to be sensed. For instance, it may be desirable to measure shear stress in the upper layers of the chip 101, and so one or more of the sense capacitors 102 may be arranged in one or more of the upper layers, such as layers 205 and/or 204. It is noted that FIG. 2 provides a relatively simple layering of the chip 101, and so the chip 101 may contain fewer than, or more than, the shown four layers on a substrate. The chip 101 may also contain further layers that may at least partially extend into (be embedded in) the substrate 201, and/or the substrate 201 itself may be composed of multiple layers of different materials, such as a silicon substrate or a silicon-on-insulator substrate.

Figure 3:
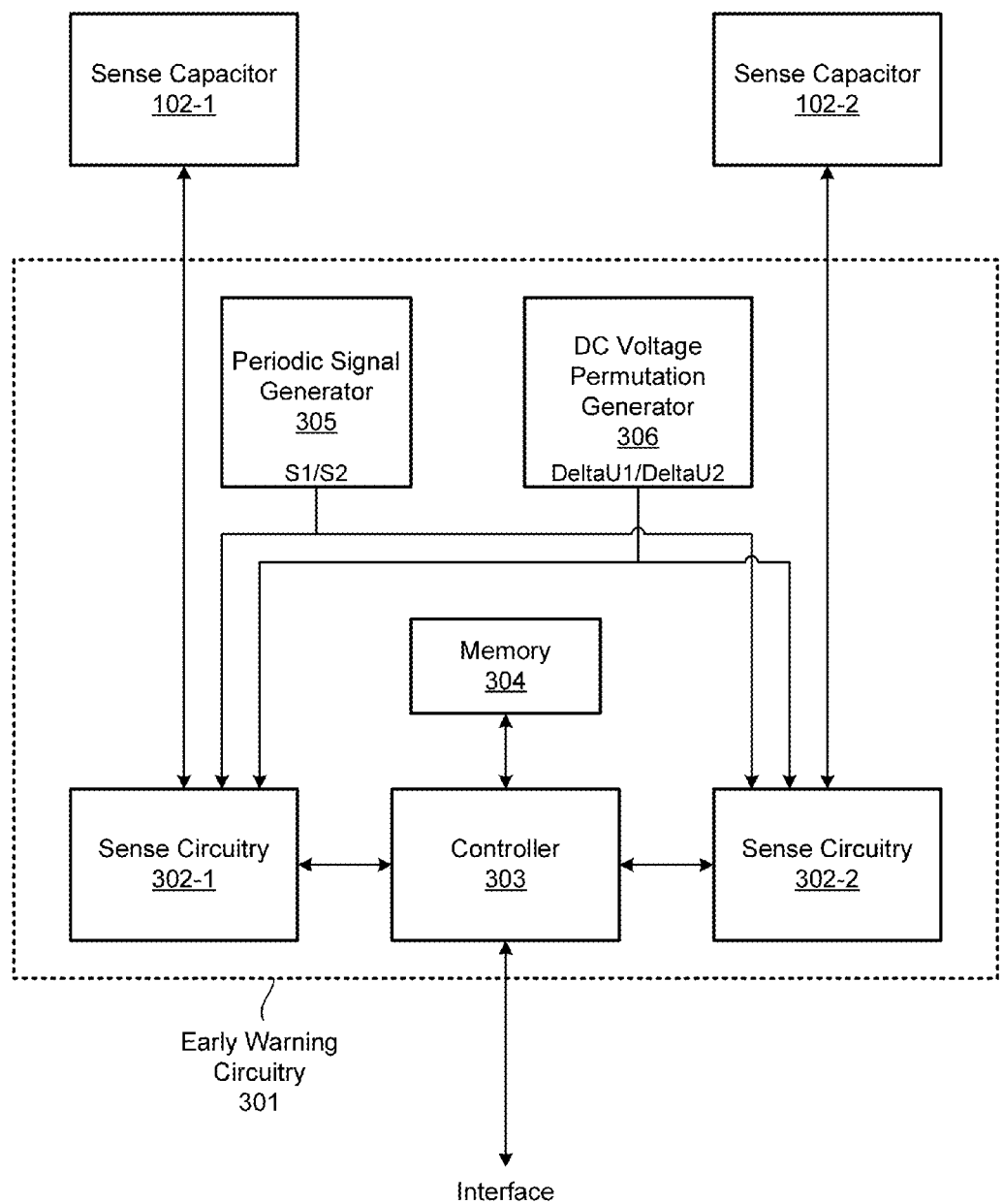
FIG. 3 is a block diagram of an example system for detecting and utilizing capacitance measurements from sense capacitors.

FIG. 3 is a block diagram of example early warning circuitry 301 for detecting and utilizing capacitance measurements from the one or more sense capacitors 102. In this example, two sense capacitors 102-1 and 102-2 are discussed. However, there may be many more sense capacitors as desired, or there may be only a single sense capacitor coupled to the early warning circuitry 301. In this example, the early warning circuitry 301 may include one or more blocks of sense circuitry 302 (e.g., 302-1 and 302-2, one for each of the two sense capacitors 102-1 and 102-2), a controller 303 such as a microprocessor and/or other control circuitry, memory 304, a periodic signal generator 305, and/or a direct-current (DC) voltage permutation generator 306. The controller 303 may be a controller dedicated to the early warning circuitry 301, or it may be a controller that is shared with other functions of the chip 101. In such a case, the controller 303 might be considered to be a unit that is functionally outside of the early warning circuitry 301. The early warning circuitry 301 and/or the controller 303 may also provide an interface function that may generate a signal and/or stored data that is based on the measurements that are taken by the one or more sense capacitors 102.

In operation, the sense circuitry 302-1 may measure the capacitance of the sense capacitor 102-1, and the sense circuitry 302-2 may measure the capacitance of the sense capacitor 102-2. As will be described below in connection with FIG. 4, the sense circuitry 302-1 and 302-2 may be driven by periodic signals S1 and S2 (generated by the periodic signal generator 305) and time-changing permutations of various DC voltages DeltaU1 and DeltaU2 (generated by the DC voltage permutation generator 306). The measurements may be made on a continuous or intermittent (e.g., sampled) basis. The sense circuitry 302-1 and 302-2 may each provide signals to the controller 303 of the measured capacitances. These signals may be provided to the controller 303 on a continuous or intermittent basis. The controller 303, in turn, may analyze the signals and/or store data representing (or otherwise based on) the measured capacitances in the memory 304 to collect a historical set of measurement data. If the controller 303 determines, based on the measurement data (based on the current measurement data and/or the stored historical measurement data), that an early warning signal should be indicated, then the controller 303 may provide an early warning signal via the interface. The early warning signal may be provided to, e.g., one or more of the conductive pins of the chip 101 and/or stored in memory such as in a status register of the chip 101. Thus, the user of the chip 101 and/or the device incorporating the chip 101 may utilize the early warning signal to determine whether to replace the chip 101 and/or whether to change the environmental conditions (e.g., by providing extra cooling to the chip 101). In making such a determination, the controller 303 may, for example, compare the historical and/or current measurement data with one or more predetermined thresholds.

The sense capacitor 102 in the present case may have an extremely small capacitance. For example, the capacitance of each of the sense capacitors 102 may be desired to be smaller than one femto-Farad (IF), or even smaller than 50 atto-Farads (aF). Moreover, it may be desirable to be able to measure variations in the sense capacitors 102 smaller than, e.g., 5 aF or less, or 0.1% or less. While larger variations may also be measured, it may be that such smaller variations may provide more useful information about changes in environmental conditions. The smaller the capacitor, the more sensitive the capacitor may be to small environmental changes.

A problem with using such extremely small capacitors, however, is that it is difficult to accurately measure their capacitance. There are several known methods for measuring capacitance. One method, known as capacitance voltage (CV) profiling, has a relatively low resolution. Another known method is the radio frequency (RF) method, which applies an RF signal to a capacitor and measures the effect of the capacitor on the signal using, e.g., a network analyzer. This method works at high RF frequencies and in a 50 ohm impedance environment, Accuracy is degraded, if the device impedance (1/(j*w*C)) deviates strongly from the 50 Ohm environment and contact capacitances additionally limit the accuracy for small capacitors. Another method is to use a parallel array of the capacitor to be measured, by cloning the capacitor in a parallel array. However, the array requires a large amount of chip real estate, and the method would be subject to averaging of the various capacitors in the array, making it insensitive to values and changes of the single devices. Yet another known method is to measure the resonance frequency of a circuit containing the capacitor and an inductor (LC resonance frequency method). While this may be an accurate method, the circuit itself would need to be very large to implement the inductor. Another known method is the floating gate method, which provides accurate relative measurements, but no absolute measurements. Yet another known method is the charge-based capacitance method (CBCM). However, the accuracy of CBCM is limited by device matching issues and by charge injection effects that induce an over-estimation of capacitance. In particular, due to opposite polarity of charge injection of NMOS and PMOS transistors of a CBCM measurement circuit, errors add up. This error increases with slew rate. Moreover, the relative error is larger for smaller measured capacitances. This and other methods also often use a reference structure to use as a reference point. Accuracy of the measurement is only as accurate as the reference structure and its match to the remainder of the measurement circuit. And, the reference structure itself takes up valuable chip real estate.

While these and many other methods may be used to measure capacitance, there are downsides to each of them. A more ideal method for measuring capacitance may have, for example, one or more of the following characteristics. First, it may be desirable that the circuitry used for measurement utilize the same type of switching device throughout the circuit (e.g., all n-type or all p-type transistors) for charging and discharging, as this may at least partially compensate for charge injection error. Second, it may be desirable that any gate switching drive signal be of a low slew rate at a given frequency, to reduce error. Third, it may be desirable to avoid de-embedding with a reference structure. Fourth, not only may it be desirable to use the same type of switching device for charging and discharging, but in fact it may be desirable to use the same switching device itself for both charging and discharging. This may further reduce sources of error, such as by eliminating any remaining charge injection matching error.

Figure 4:
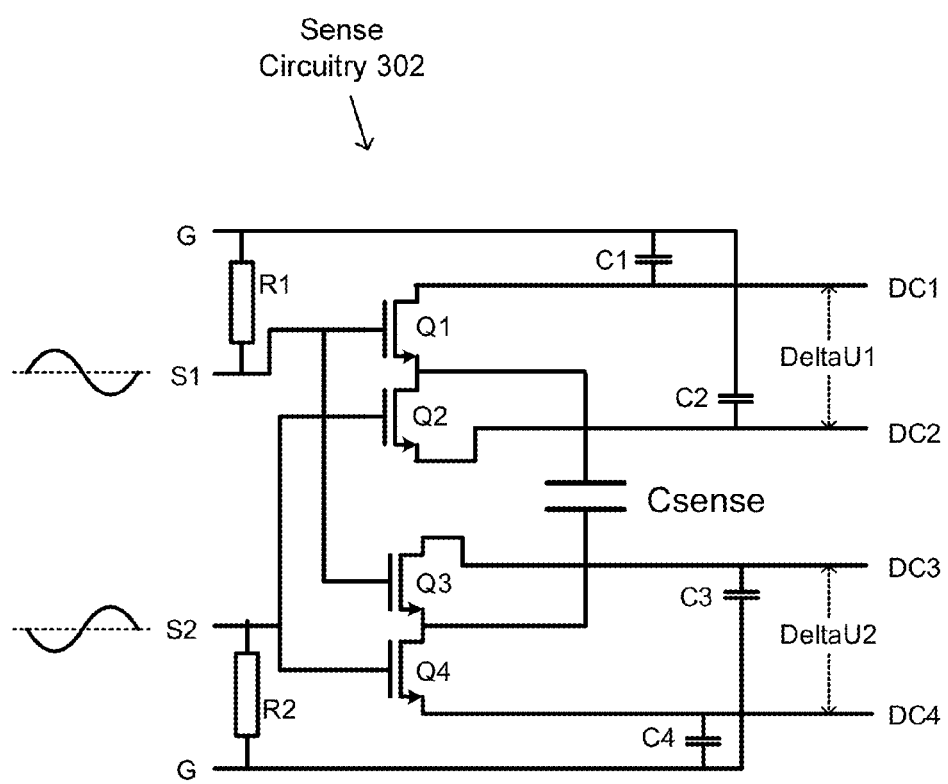
FIG. 4 is a schematic diagram of example sense circuitry that may be used to measure capacitance of a capacitor.

FIG. 4 is a schematic diagram of example of how the sense circuitry 302 may measure capacitance of a capacitor such as one of the sense capacitors 102, without the need for a reference structure. The example of FIG. 4 may have at least some of the above-mentioned desirable characteristics. For instance, this example uses in-situ de-embedding, and provides for almost perfect cancellation sense device non-idealities, sense device variation and matching, parasitic capacitances, leakage currents, and instrument offsets. Moreover, the example provides for a relatively efficient usage of chip real estate.

In the example of FIG. 4, the capacitance being measured is referred to as Csense. The sense circuitry 302 in this example includes two resistors R1 and R2, four n-type metal-oxide semiconductor (NMOS) transistors Q1, Q2, Q3, and Q4, and four capacitors C1, C2, C3, and C4. However, the sense circuitry 302 may be embodied in other variations, such as by using a different type of transistors (e.g., where transistors Q1, Q2, Q3, and Q4 are all p-type transistors or the transistors Q1, Q2 are n-type transistors while the transistors Q3 and Q4 or vice versa, i.e. the same type of device (e.g. NMOS or PMOS) is used for the transistor pairs, i.e. for transistors Q1 and Q2 and for transistors Q3 and Q4, e.g. in case of different DC voltages on both sides), with any minor adjustments to interconnections and other components as appropriate. In the shown example, two gate drive signals S1 and S2 are fed into the circuit at the shown nodes. Signal S1 drives the gates of transistors Q1 and Q3, and signal S2 drives the gates of transistors Q2 and Q4. Signals S1 and S2 may be identical waveforms but of opposite phase (180 degrees out of phase), such as 180 degree out-of-phase sine waves. Other types periodic opposing signals may alternatively be used. As mentioned previously, signals S1 and S2 may be generated by the periodic signal generator 305. Circuitry for generating signals such as signals S1 and S2 are well-known and need not be described in detail herein. The sense circuitry 302 also includes four direct-current (DC) inputs, labeled in FIG. 4 as DC1, DC2, DC3, and DC4, as well as ground nodes (G) configured as shown.

In the present example, the NMOS transistors Q1-Q4 each have gates that are 250 nanometers in length and 60 nanometers in width, resistors R1 and R2 each provide a resistance of 50 ohms, capacitors C1-C4 each provide a capacitance of 10 pF, and signals S1 and S2 each has an amplitude of 100 mV. It has been found that these values work well for accurately measuring Csense when Csense is on the order of about 50 aF. However, other values of any of the components and/or signals for the sense circuitry 302 may be used. It is also possible to omit the resistors R1 and R2 and the capacitors C1-C4, if the signal generator and the control circuit can achieve suitable (e.g. sinus) waveforms S1 and S2 and constant DC voltages DC1-DC4.

In operation, the signals S1 and S2 continuously drive the gates of the transistors Q1-Q4, and DC voltages are applied in various permutations across the DC inputs DC1-DC4. The currents measured through the DC inputs DC1-DC4 during the various DC voltage permutations are then combined to calculate Csense. In the present example, DeltaU1 is the voltage difference between DC1 and DC2 and DeltaU2 is the voltage difference between DC4 and DC3. The set of DC voltage permutations PA, PB, PC, and PD that may be applied while signals S1 and S2 are driving the transistors gates are: [P=Delta U1, Delta U1]=[PA=+X,+X; PB=+X,−X; PC=−X,+X; PD=−X,−X], where X is a predetermined positive voltage value. In the present example, X=100 mV, however X may be another value as desired. Table 1 below shows an example where X=100 mV. The permutations of DeltaU1 and DeltaU2 may be applied in any time order desired, and not necessarily in the order as shown in Table 1 or anywhere else in the present specification. As previously mentioned, voltages DeltaU1 and DeltaU2 may be generated by the DC voltage permutation generator 306. Circuitry for generating various patterns of DC voltage as desired are well-known and need not be described in detail herein.

TABLE 1

|    | DeltaU1  | DeltaU2  |
|----|----------|----------|
| PA | 100 mV   | 100 mV   |
| PB | 100 mV   | −100 mV  |
| PC | −100 mV  | −100 mV  |
| PD | −100 mV  | 100 mV   |

To determine Csense, the currents through the DC nodes DC1-DC4 are summed, for each permutation, without regard to current direction (i.e., their absolute values are summed). Thus, if during one of the DC voltage permutations P, the current through DC1 is I1, the current through DC2 is I2, the current through DC3 is I3, and the current through DC4 is I4, then the summed currents for that DC voltage permutation P would be (I1+I2+I3+I4). The summed currents for each permutation PA, PB, PC, and PD, respectively, are referred to as IA, IB, IC, and ID. Once these are determined, Csense may be calculated as follows:

Csense is proportional to (IB−IA)+(ID−IC).

Thus, in this example, determining Csense (or a value proportional to the actual value of Csense) involves applying the signals S1 and S2 while the four permutations PA, PB, PC, PD are applied to the DC inputs DC1-4, determining the summed currents for each permutation, and then combining the summed currents for the four permutations as indicated above. As the change in Csense may be more interesting than the actual value, it may not be necessary to measure the actual value of Csense, but rather a value proportional to Csense, such as the value that is equal to (IB−IA)+(ID−IC).

The above calculations may be performed by, for example, the controller 303. Moreover, the historical data stored in the memory 304 may be data representing values of Csense sampled over time. To determine the difference between elastic (reversible) and plastic (irreversible) deformation of the sense capacitor 102, the controller may compare measurements before and after a pressure load, and use hysteresis principles to determine whether the pressure load caused elastic or plastic deformation of the sense capacitor 102.

Figure 5:
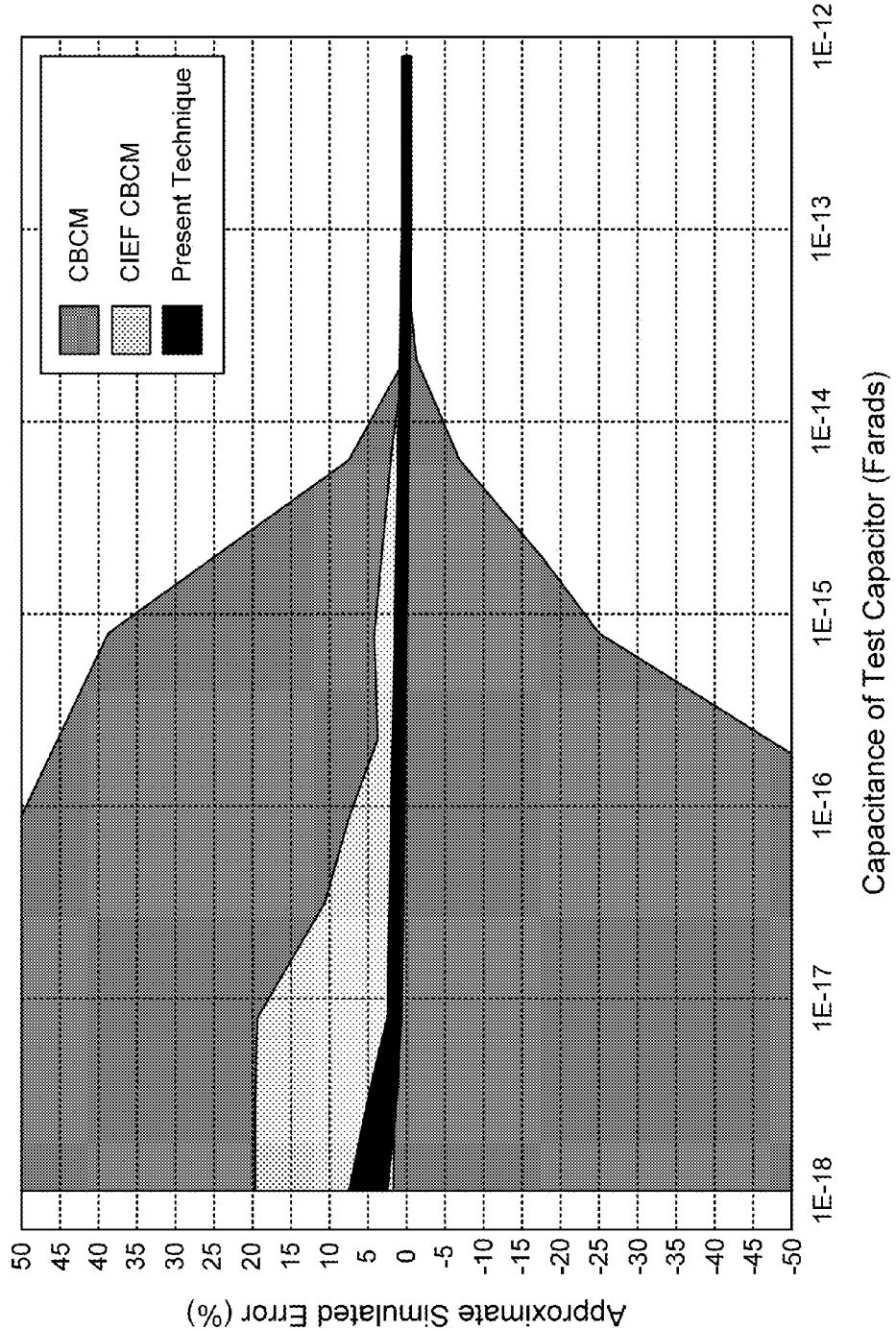
FIG. 5 is a graph that compares example approximate simulated performances of various techniques for measuring capacitance.

FIG. 5 is a graph that compares example approximate simulated performances of various techniques for measuring capacitance. In particular, the graph compares the conventional charge-based capacitance measurement (CBCM) and charge-injection-induced error-free (CIEF) CBCM techniques with the technique described in connection with FIG. 4. As can be seen in the graph, and as found during simulations, the CBCM and CIEF CBCM techniques appear to introduce rapidly increasing errors as the capacitance being measured becomes smaller. Where the capacitance being measured is on the order of 1E-18 Farads, the error is quite large using CBCM and CIEF CBCM. In contrast, using the present technique of FIG. 4 may introduce substantially less error, especially at lower test capacitances.

Figure 6:
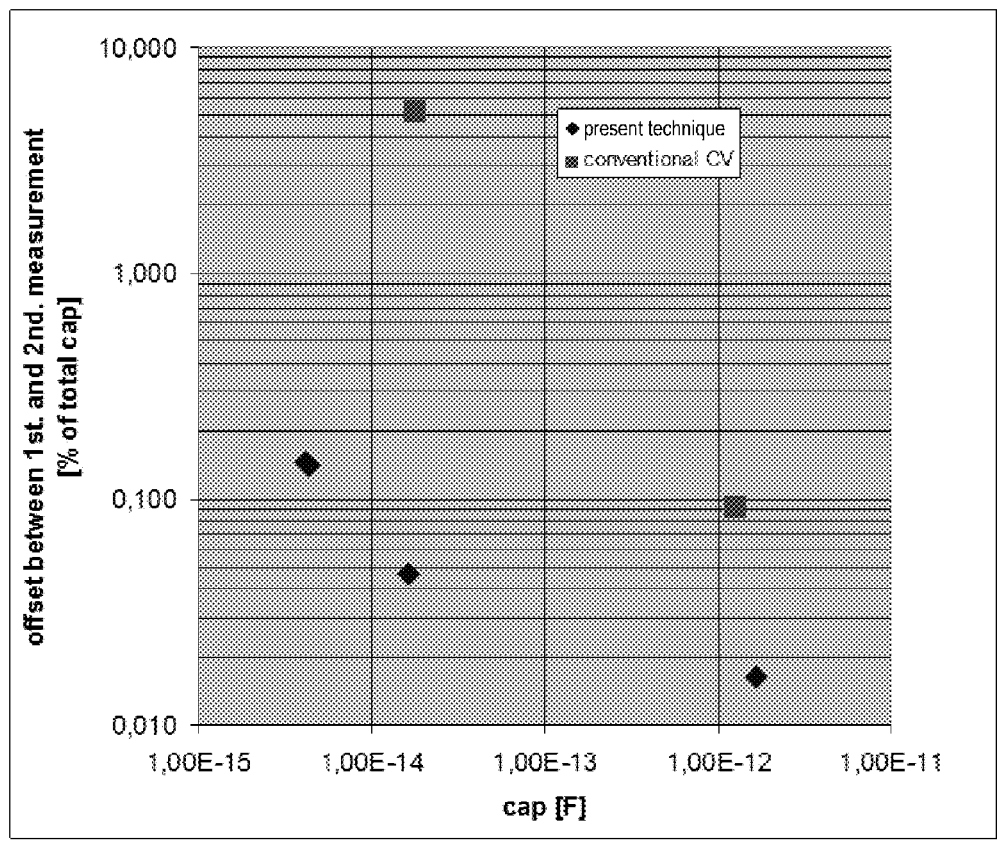
FIG. 6 is another graph that compares further example approximate simulated performances between a conventional technique and a technique described herein.

As further shown in FIG. 6, the offset between first and second measurements, as simulated, may be significantly reduced as compared with conventional capacitance voltage (CV) profiling techniques.

Figure 7:
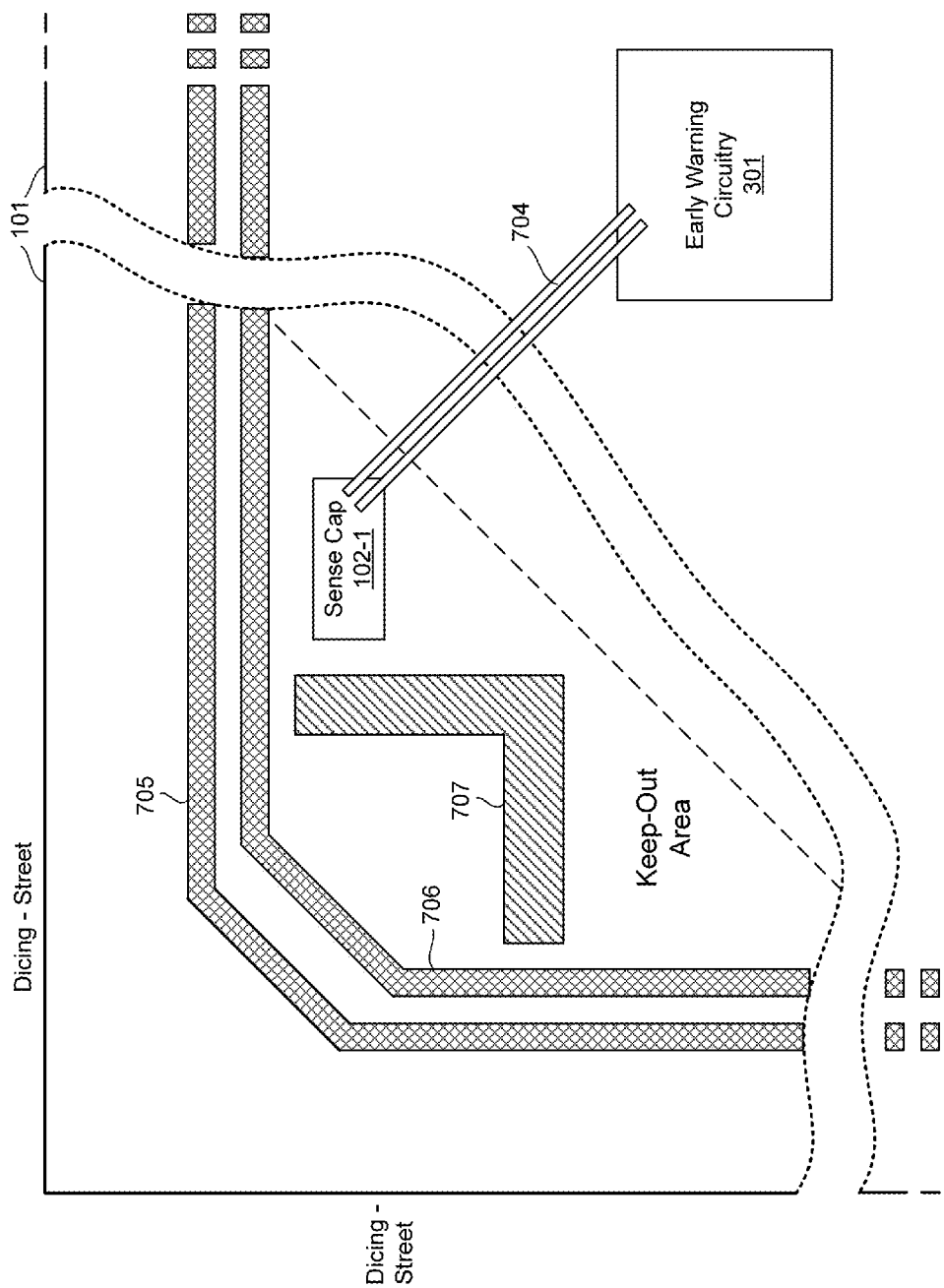
FIGS. 7-13 are plan views of example layout arrangements of sense capacitors and related circuitry within a semiconductor chip.

FIGS. 7-13 are non-limiting examples of plan views arrangements of sense capacitors and related circuitry within the chip 101. In the example of FIG. 7, a state of the art semiconductor chip 101 often includes a moisture bather made up of a double seal ring composed of ring 705 and ring 706. The rings 705,706 may extend completely around the chip 101 near the perimeter of the chip 101, including extending through one or more keep-out areas of the chip 101. Keep-out areas are areas that, for a variety of design reasons, are not normally used for circuitry. For instance, keep-out areas may be less reliable regions of a semiconductor chip. Because the sense capcitors 102 discussed herein may be used to provide early warning of chip failure, such keep-out areas may be excellent locations for placing at least some of the sense capacitors 102. In fact, damage to the keep-out areas may result in capacitance changes of the sense capacitors 102, thereby providing early warning that the keep-out areas (typically near the perimeter of the chip) have been degraded. Moreover, since the keep-out areas are not normally used for other circuitry, the addition of sense capacitors 102 to the keep-out areas would likely have little to no impact on the amount of chip 101 real estate available to the remaining circuitry. And, in this example, at least some of the sense capacitors 102 may be located near an edge of the chip 101, and thus may provide an earlier warning as to moisture intrusion than would occur if the sense capacitors 102 were located further toward the middle of the chip 101, such as in the active area of the chip 101.

In the example of FIG. 7, then, the sense capacitor 102-1 is shown by way of example as being located in a keep-out area of the chip 101. Keep-out areas may be of any size and shape, however they are typically triangular in shape, include each corner of the chip, and extend from the corner approximately 50 to 100 micrometers on each chip edge. In this example, the sense capacitor 102-1 is located within the perimeter defined by the inner side of the inner ring 706, and also interior to a crackstop structure 707 (e.g., not between the crackstop structure 707 and an edge of the chip 101. The early warning circuitry 301 may also be located in the keep-out area, although in this example the early warning circuitry 301 is located further toward the interior of the chip 101, in the active chip area (not within the keep-out area). The early warning circuitry 301 may be coupled to the sense capacitor 102 by one or more conductive lines 704, and may operate in accordance with the description herein in connection with FIGS. 3 and 4.

Other variations are possible. For instance, in any of the examples described herein, the sense capacitors 102 may additionally or alternatively detect temporary (elastic) or permanent (plastic) mechanical deformations during temperature variations or temperature cycles or mechanical deformations due to intrinsic stress in the chip package. Also, cracks or delamination in the substrate or in the interconnect levels may be detected, especially if the cracks extend through the sense capacitor or are created in the near vicinity of the sense capacitors. These cracks may be created by dicing, wafer thinning, probing, bonding, soldering or during the assembly process. This type of detection may be provided regardless of the locations of the sense capacitors 102 within the chip 101.

Figure 8:
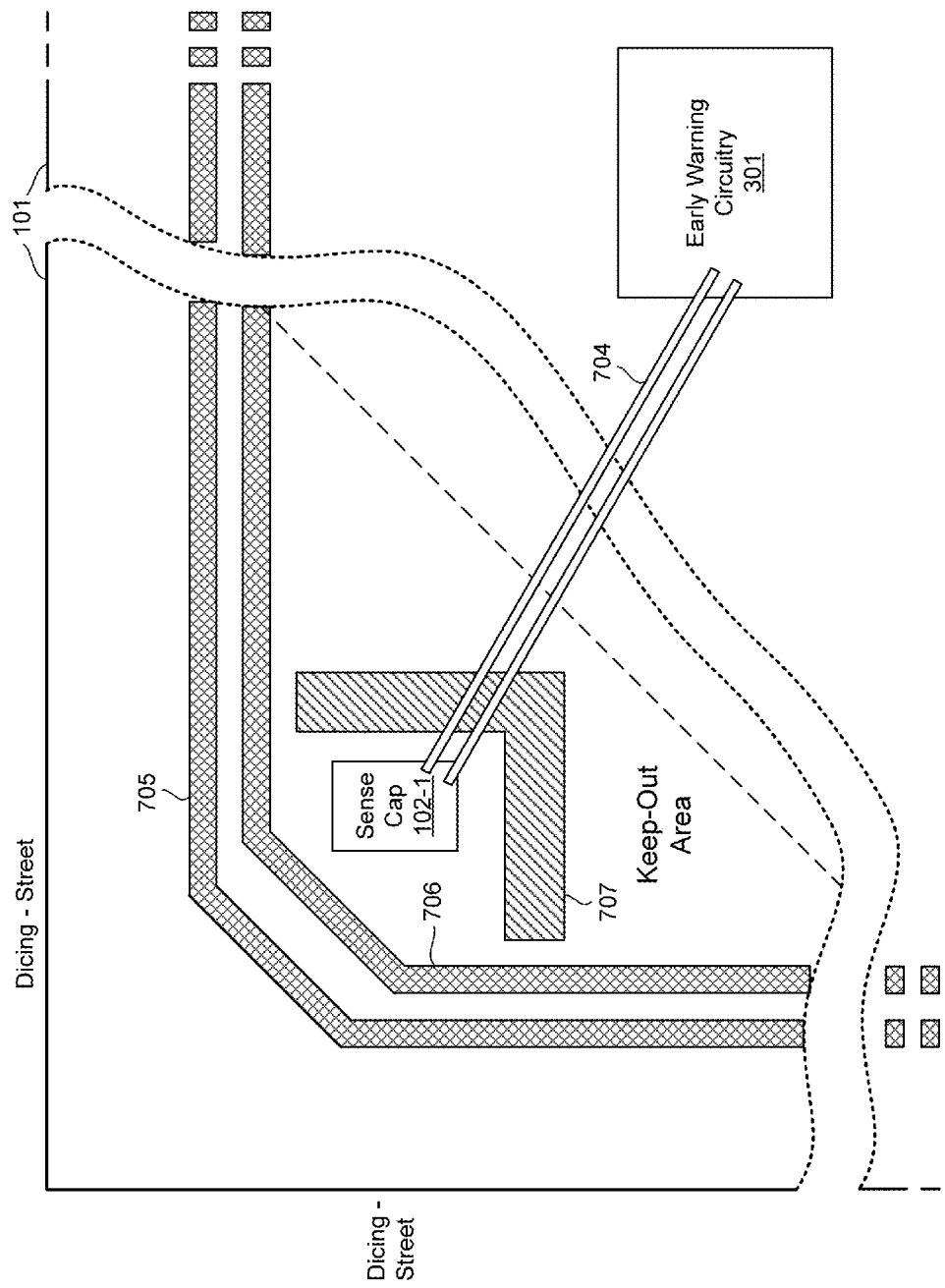
Figure 9:
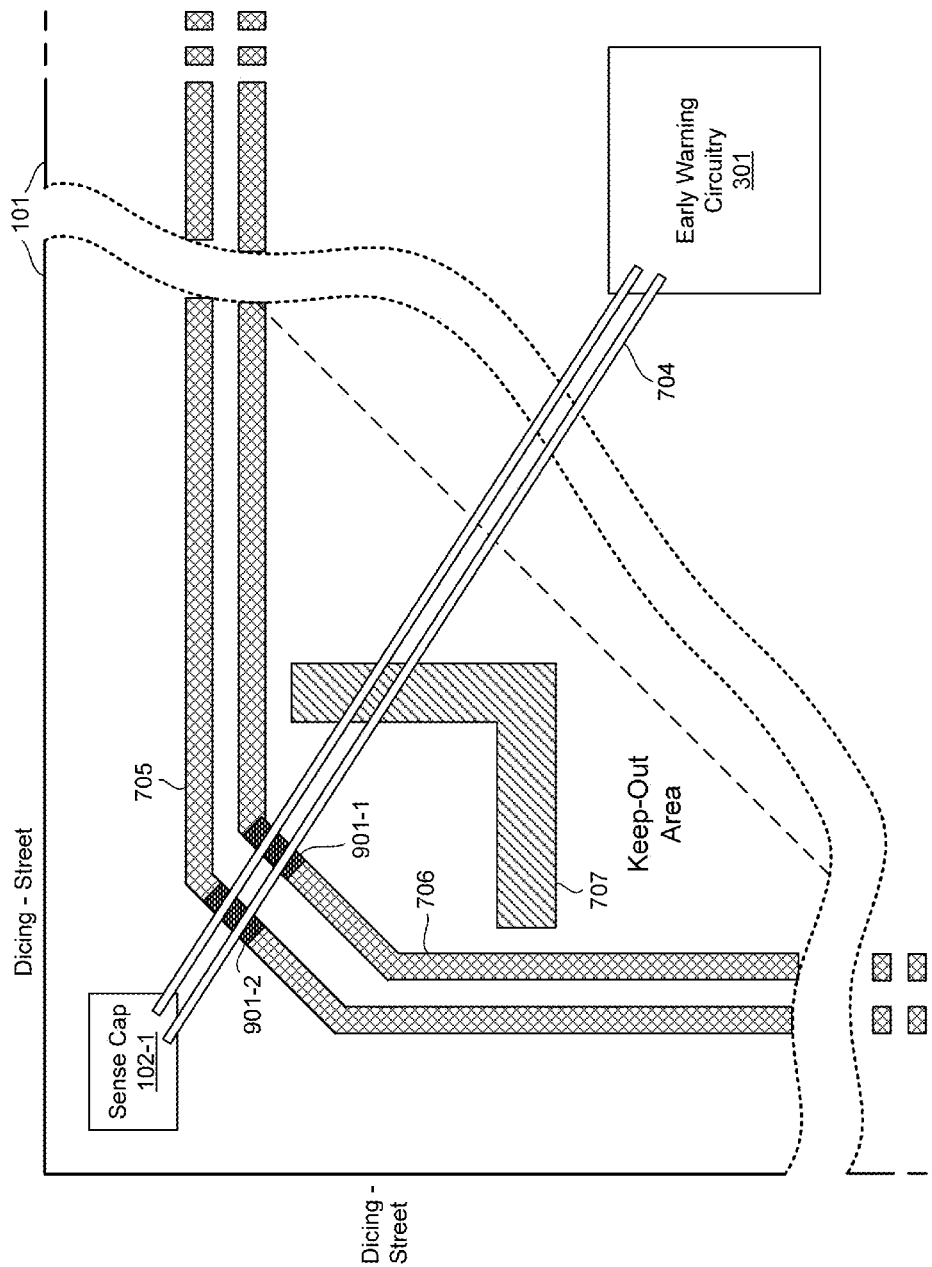

As another example, FIG. 8 shows the sense capacitor 102-1 being between the crackstop structure 707 and the rings 705,706, and also between the crackstop structure 707 and the edge of the chip 101. FIG. 9 shows an example in which the sense capacitor 102-1 is outside of the rings 705,706, between an outer side of the ring 705 and the edge of the semiconductor chip. Where one or more of the sense capacitors 102 and the sense circuitry are on opposite sides of one or more of the rings 705,706, the rings 705 and/or 706 may include an opening 901-1,901-2, such as only at the aluminum layer level, through which the one or more conductive lines 704 may pass. This aluminum layer may be disposed, for example, on the mechanically weaker and moisture permeable Cu/low k metallization levels. Typically, this aluminum layer is surrounded or embedded by more mechanically stable dielectrics such as Si-oxide, Si-nitride, Si-oxynitride, which are impermeable to moisture. Thus, any interruption or opening of the seal ring 705 and/or 706 in the top most aluminum layer to allow the wiring of the conductive lines 704 may be provided without necessarily degrading the edge seal performance of the seal rings 705 and/or 706.

Figure 10:
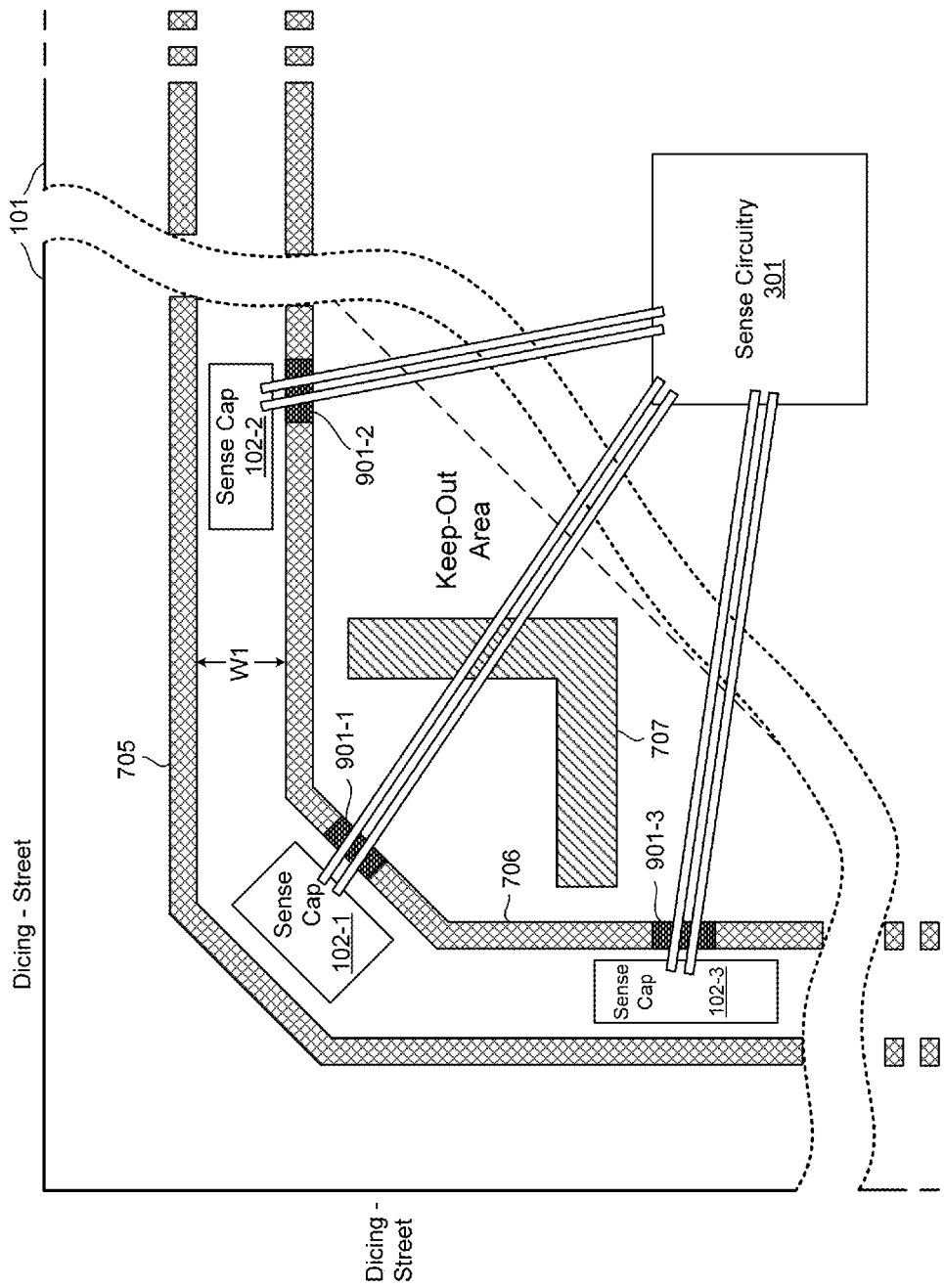
Figure 11:
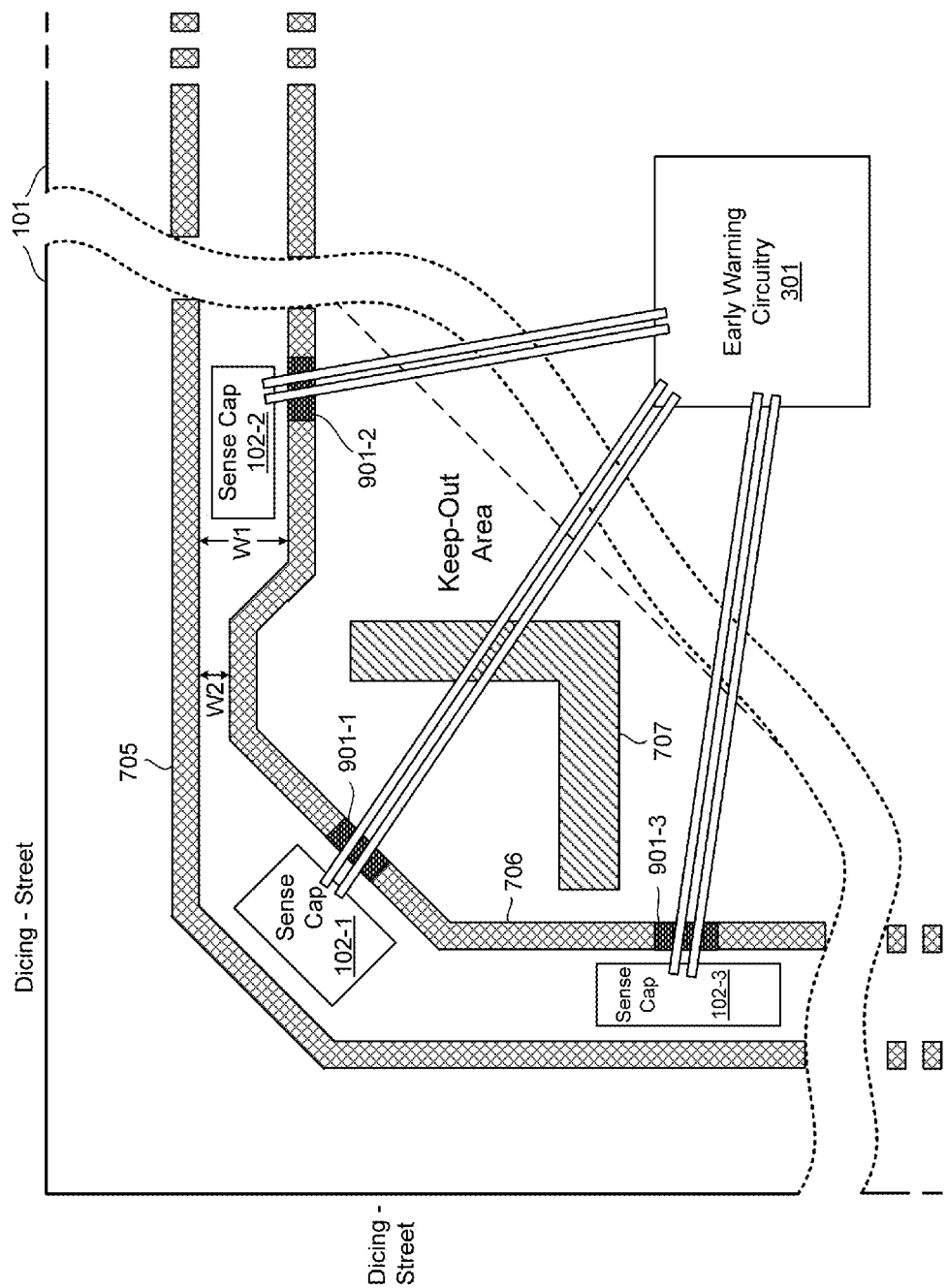

FIG. 10 shows an example in which one or more sense capacitors 102-1, 102-2, 102-3 are disposed between the pair of rings 705,706. In this case, the rings 705,706 may be separated by a separation distance W1 that may be larger than a typical separation distance between the dual rings. FIG. 11 shows an example in which the one or more sense capacitors 102-1, 102-2, 102-3 are disposed between the pair of rings 705,706, and wherein the rings 705,706 are routed around the sense capacitors 102 as needed to reduce the average separation distance between the dual rings as compared with the example of FIG. 10. In the FIG. 11 example, the rings 705,706 may vary with a separation distance of between W1 and W2 (where W2 may be a more typical separation distance).

Figure 12:
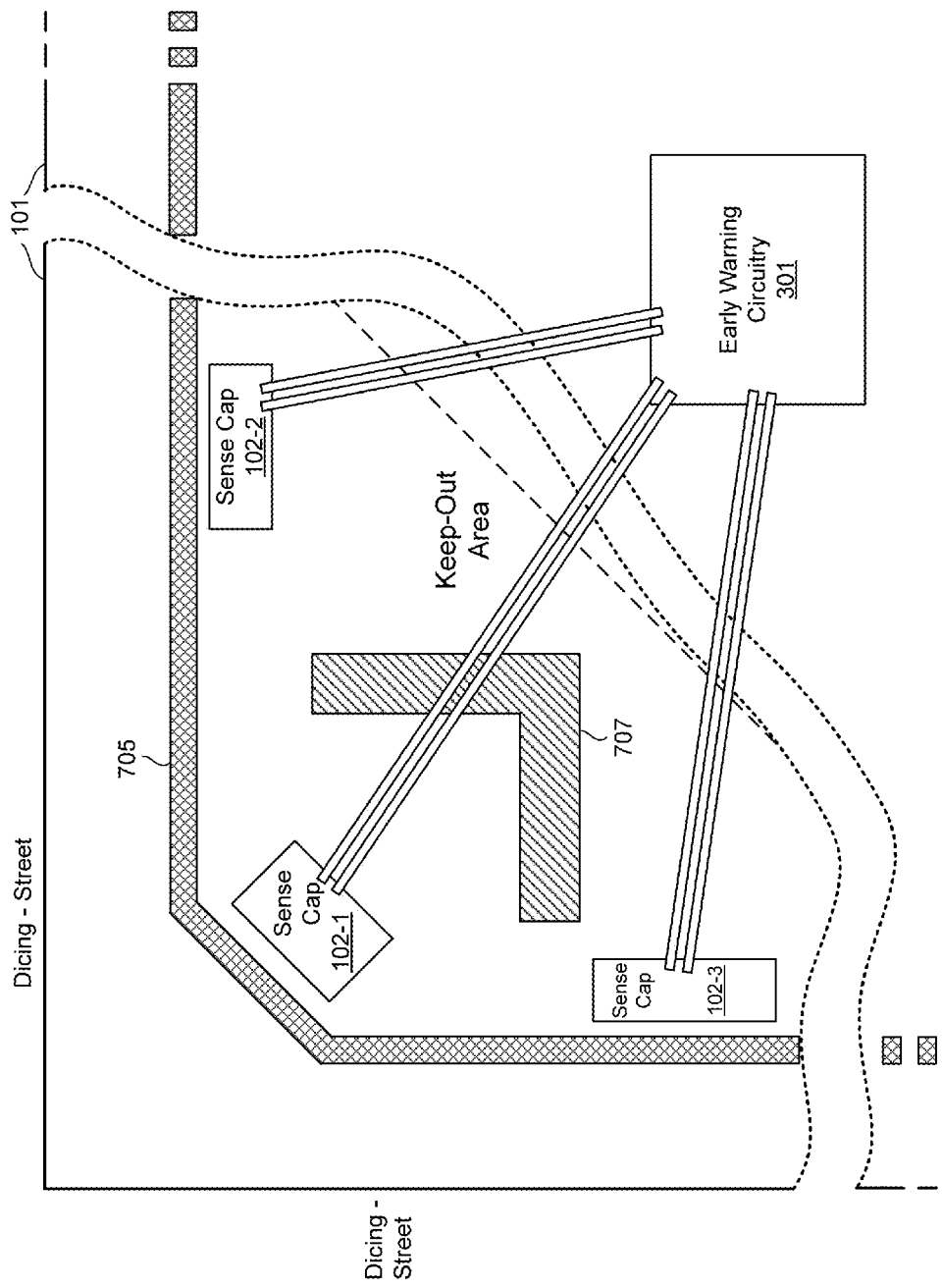

FIG. 12 shows another example in which multiple sense capacitors 102-1, 102-2, 102-3 are arranged within the keep-out area, and in which only a single ring 705 (or 706) is utilized. Because the sense capacitors 102 may be used for early detection of moisture intrusion, there may be less of a desire or need for the inner ringer 706. In this case, replacing the inner ring 706 with the sense capacitors 102 may result in a large percentage (e.g., 80 to 90 percent) of active chip area in a stripe (e.g., 3 to 15 micrometers in width) along the circumference of the chip 101 to be reclaimed.

Figure 13:
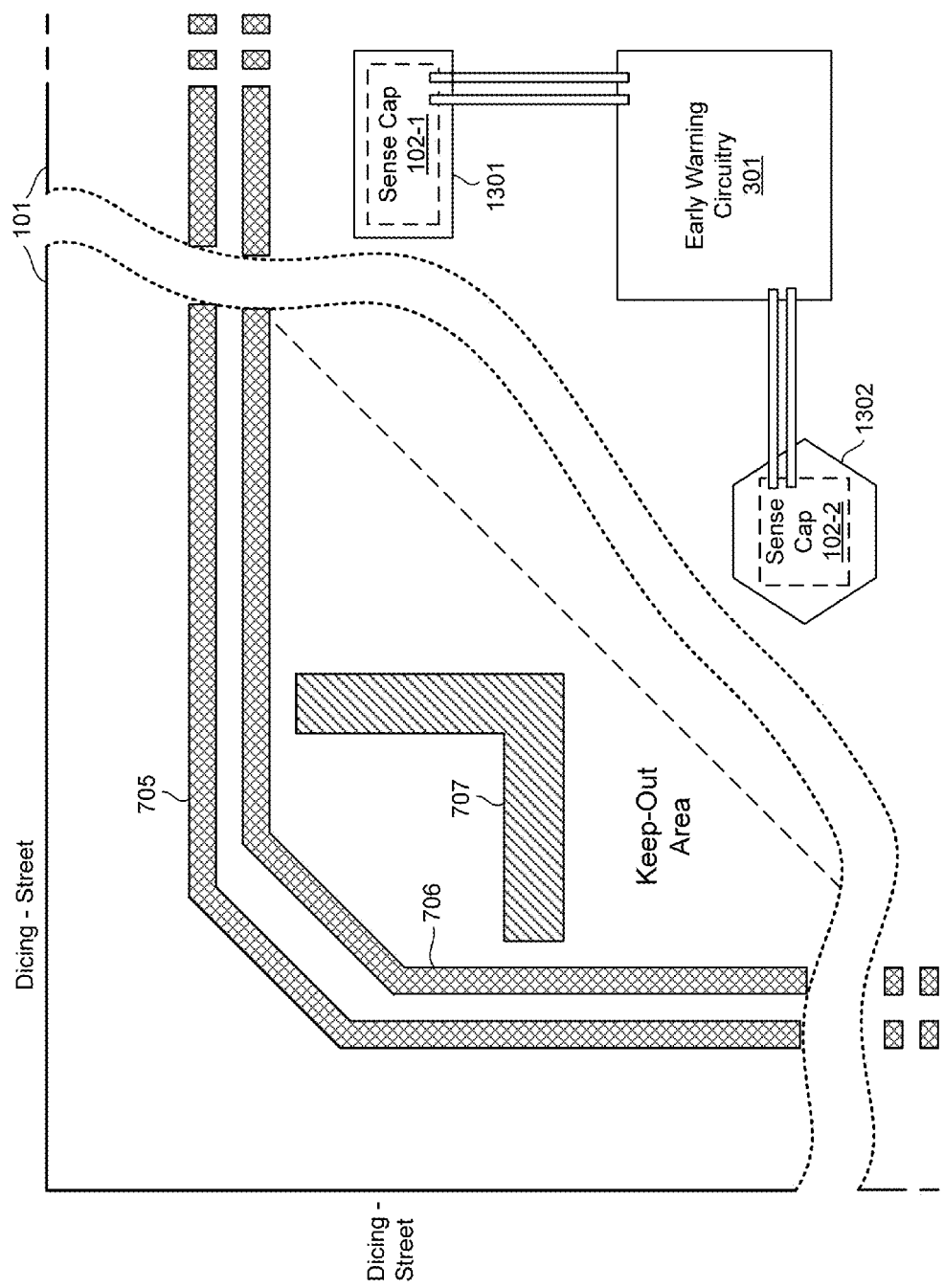

FIG. 13 illustrates an example in which the sense capacitors 102-1, 102-2 are located in the active area of the chip 101 (rather than in the keep-out area). While the sense capacitors 102 may be located anywhere, in this example the sense capacitors 102 are disposed under a wirebond probe pad 1301 and under a flip-chip bump pad 1302. This may be especially useful for monitoring for excess pressure and/or temperature during manufacturing steps such as during bonding and probing of the chip 101.

Other layouts of the sense capacitors 102 and the early warning circuitry 103 are possible. For example, any of the embodiments disclosed herein may have a fewer or greater number of sense capacitors 102. Also, while only a single unit of the early warning circuitry 301 is explicitly shown in the figures, a given chip 101 may have two or more early warning circuitry 301 units distributed at different locations of the chip 101.

FIGS. 14-17 are side cutaway view of example configurations of sense capacitors 102, and FIGS. 18A-18L are plan views of example sense capacitor 102 configurations. Capacitors typically include at least two electrical nodes that are physically separated from each other, usually with dielectric disposed between the nodes. For convenience, in the examples of FIGS. 14-18, one of the electrical nodes is depicted by cross-hatching (for instance, elements 1402 of FIG. 14) and the other of the electrical nodes is depicted by a checkered dot pattern (for instance, elements 1403 of FIG. 14). As will be seen, where multiple physical elements are used for a given one of the nodes, those elements may be electrically tied together (to result in a single electrical node with multiple distributed elements) or they may be electrically isolated from one another. In the latter case, such electrical isolation to create more than two nodes may be useful to provide information about the location and/or direction of travel of a changing environmental condition relative to the sense capacitor 102.

Figure 14:
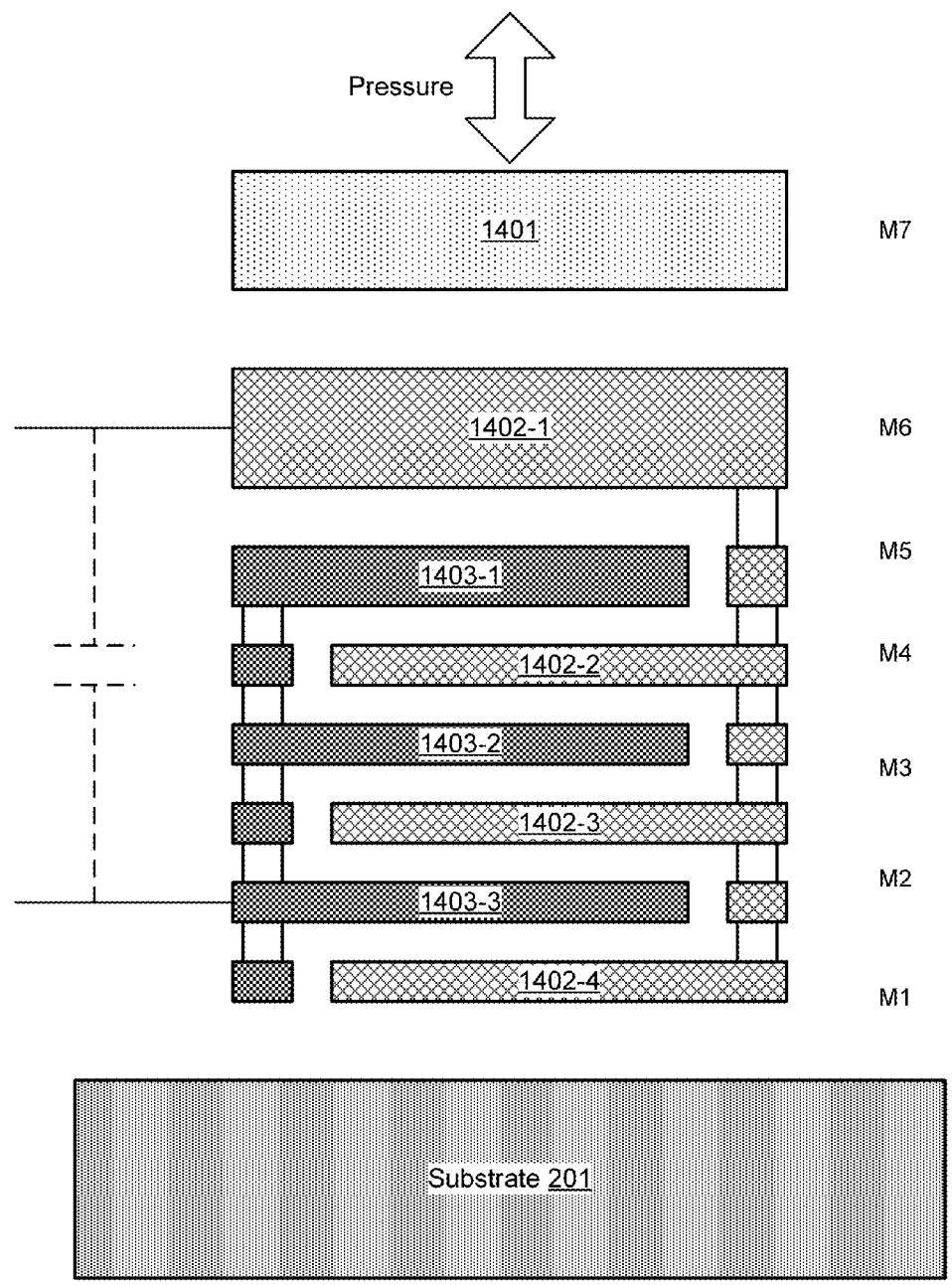
FIGS. 14-17 are side cutaway view of example configurations of sense capacitors.

In the example of FIG. 14, the sense capacitor 102 may include multiple interconnected conductive layers 1402-1, 1402-2, 1402-3, 1402-4 of a first electrical node interleaved with multiple interconnected conductive layers 1403-1, 1403-2, 1403-3 of a second electrical node. The layers 1402, 1403 may be configured as elongated fingers, rectangular plates, circular plates, or in any other shape desired. The capacitor may further include an upper pressure plate 1401 for transferring downward and upward pressure or other forces to the sense capacitor 102. As pressure is applied to the plate 1401, portions of the sense capacitor 102 such as the dielectric regions between the interleaved layers 1402, 1403 may slightly compress or expand, thereby changing the overall capacitance of the sense capacitor 102. This particular embodiment of the sense capacitor may be sensitive to downward and upward pressure, temperature, and moisture, and perhaps less sensitive to shear forces and lateral forces. In this example, and in other examples, the various elements of the sense capacitor 102 may coexist with other features of the chip 101 at one or more of various layer levels M1-M7, for example. The pressure plate 1401 of this example may have the function of a wirebond probe pad or a flip-chip bump pad, if desired. In this case, the sense capacitor 102 placed underneath this pressure plate or pad 1401 may be able to detect mechanical stresses and associated deformations during probing and bonding processes.

Figure 15:
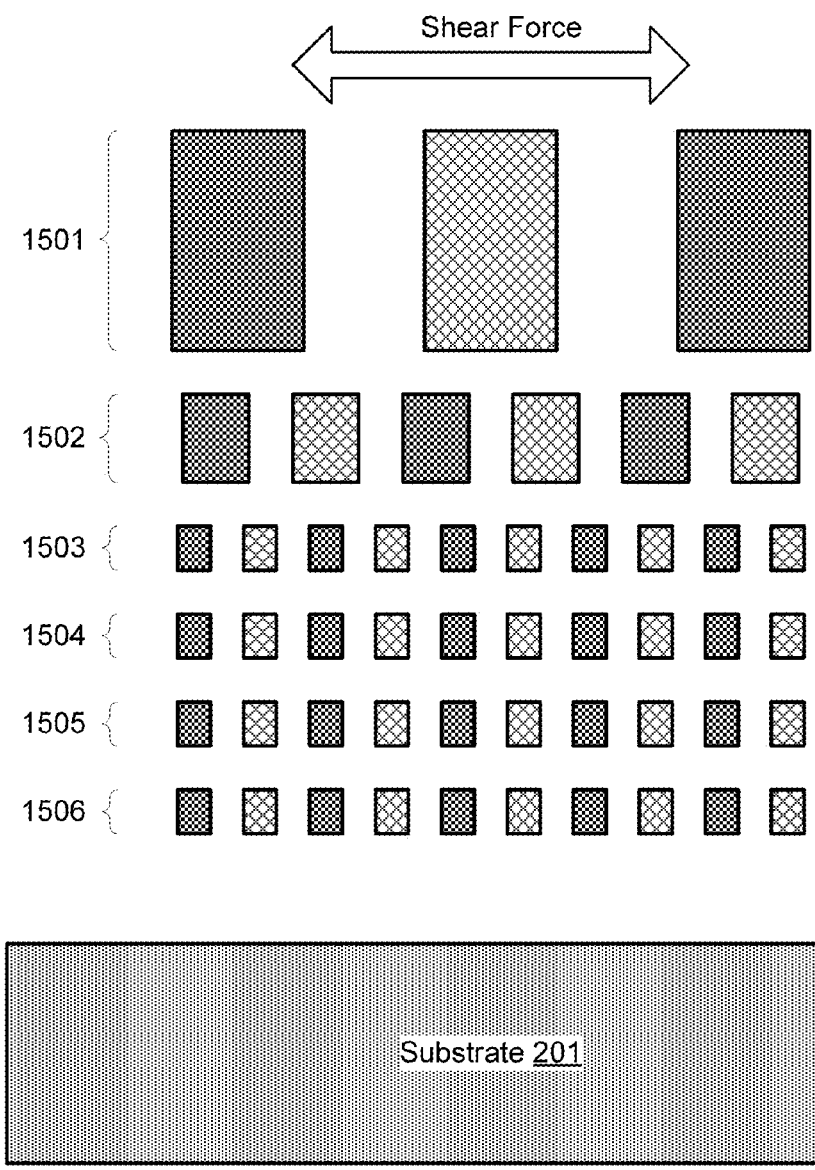

FIG. 15 shows another example of a sense capacitor 102, in this case one that includes multiple levels of laterally-interleaved electrical node elements. Thus, for a given horizontal level, there may be a plurality of separate conductive elements, each alternating the one of the two electrical nodes of the sense capacitor 102. Moreover, one or more of the levels may have elements that are of a different size than one or more of the other levels. This particular capacitor configuration may be sensitive to downward and upward pressure, temperature, moisture, shear (e.g., bowing/warping) forces, and lateral forces.

Figure 16:
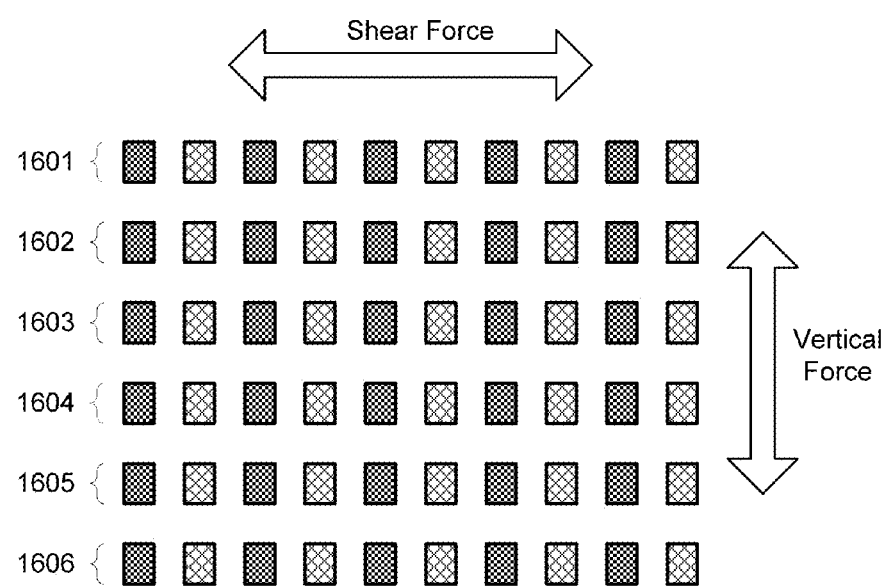
Figure 16:
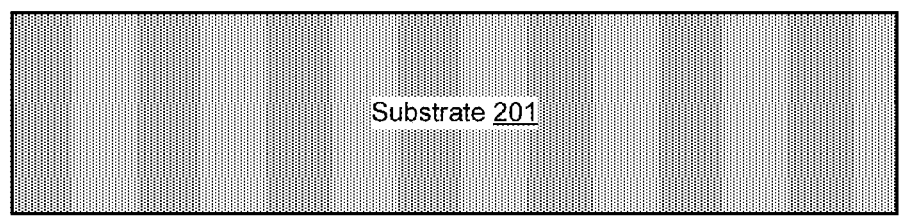

FIG. 16 shows another example of a sense capacitor 102, similar to that of FIG. 15, except that each level may contain elements of the same size.

Figure 17:
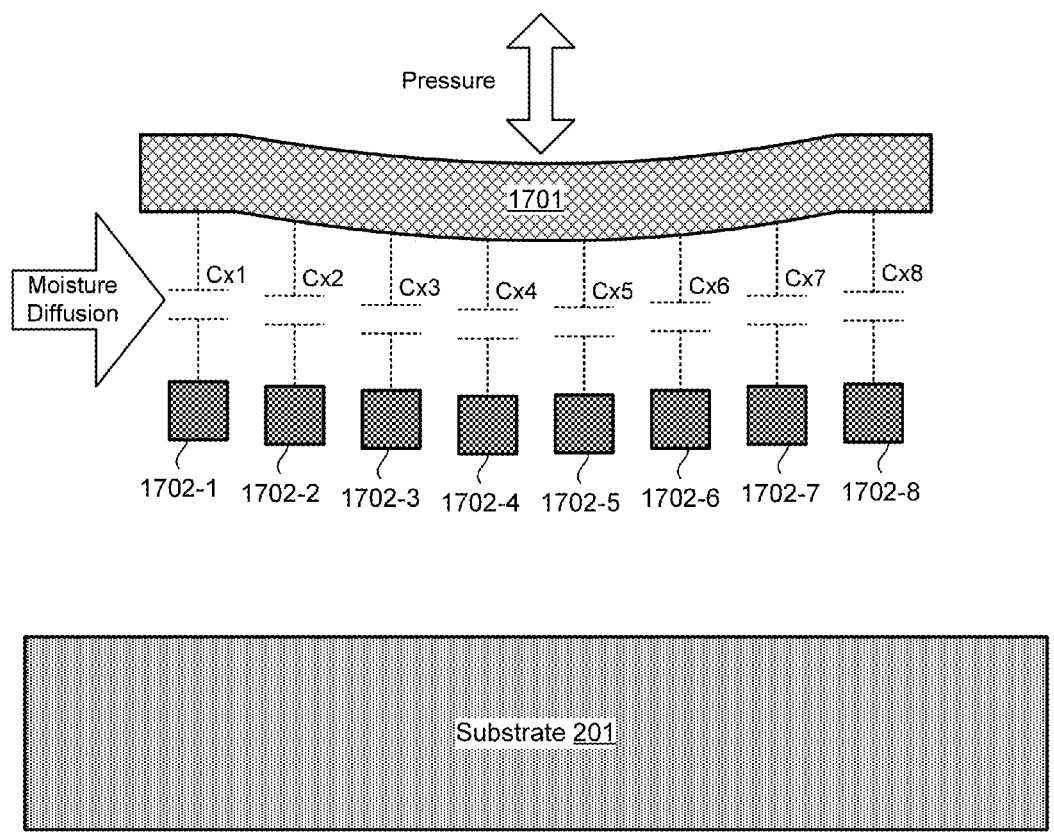

FIG. 17 shows an example of a sense capacitor 102, in which one of the electrical nodes is made up of a single conductive plate 1701 (or finger) and the other one of the electrical nodes is made up of a plurality of conductive fingers 1702-1 to 1702-8. While eight fingers 1702 are shown, there may be fewer than eight or more than eight, as desired. In this example, each of the fingers may be electrically tied together or they may be electrically isolated from each other. Where electrically isolated, the individual capacitance Cx1-Cx8 between each of the fingers 1702 may be measured, and so a changing environmental condition, such as moisture intrusion, may be isolated to be coming from a particular direction and/or at a particular rate. For instance, where moisture intrudes from the left side of FIG. 17, then capacitance Cx1 may be affected more than, say capacitance Cx8. The relative change and/or difference between the various capacitances Cx1-Cx8 may therefore provide directional and/or temporal information about the moisture intrusion and/or moisture diffusion. Likewise, where downward or upward pressure is applied to the plate 1701, the lateral location of the downward or upward pressure may be determined based on the relative changes of capacitances Cx1-Cx8 due to the induced local deformation of the one or more capacitance regions within the sense capacitor 102. Thus, where the individual electrodes are electrically isolated as in FIG. 17, the sense capacitor 102 may allow for localized/space-resolved detection of environmental conditions. The example of FIG. 17 may also be thought of as showing eight sense capacitors, each sharing a common plate 1701 as one of the electrical nodes of the sense capacitors.

Figure 18A:
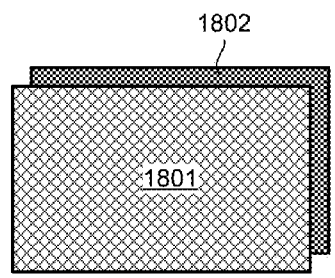

FIG. 18A shows a plan view of an example sense capacitor 102 that uses a simple dual-plate or dual-finger configuration. In this example, two opposing plates or fingers 1801, 1802 are separated by dielectric material.

Figure 18B:
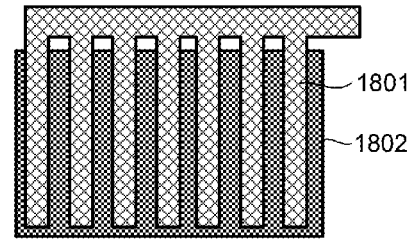

FIG. 18B shows a plan view of another example of a sense capacitor 102, in which the element includes multiple fingers, and in which element 1802 is a plate. In this example, all of the fingers of element 1801 are electrically tied together.

Figure 18C:
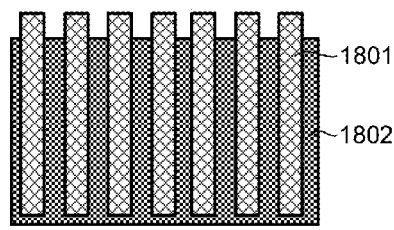

FIG. 18C shows a plan view of another example of a sense capacitor 102, similar to that of FIG. 18B. In this example, the fingers of the respective element 1801 are not electrically tied together. Thus, this example may allow for locational and/or directional determination of environmental factors, in a manner similar to that described with regard to FIG. 17.

Figure 18D:
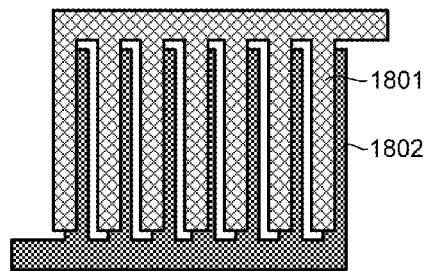

FIG. 18D shows a plan view of another example of a sense capacitor 102, in which both of the elements 1801 and 1802 contain multiple fingers. In this example, all of the fingers of element 1801 are electrically tied together, as are all of the fingers of element 1802.

Figure 18E:
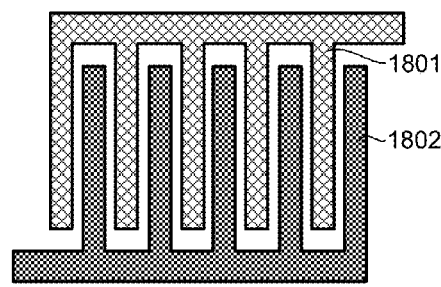

FIG. 18E shows a plan view of another example of a sense capacitor 102, in which both of the elements 1801 and 1802 contain multiple fingers that, while remaining at their respective vertical levels, are laterally interleaved. In this example, all of the fingers of element 1801 are electrically tied together, as are all of the fingers of element 1802.

Figure 18F:
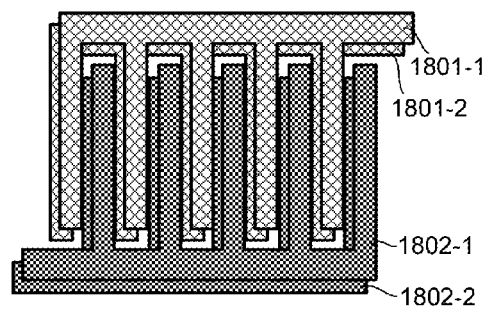

FIG. 18F shows a plan view of another example of a sense capacitor 102, similar to that of FIG. 18E. However, in this case, the elements 1801 and 1802 are provided in multiple metallization levels, in particular as elements 1801-1, 1801-2, 1802-1, and 1802-2. In this example, the levels may be interleaved so that, vertically, the layers alternate as 1801-1, 1802-1, 1801-2, 1802-2.

Figure 18G:
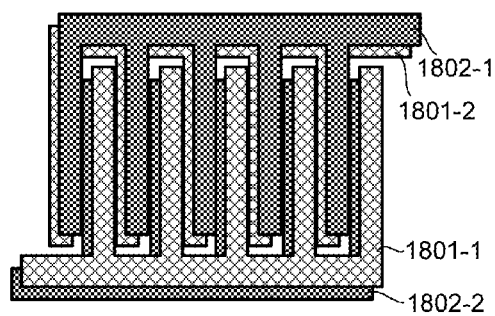

FIG. 18G shows a plan view of another example of a sense capacitor 102, similar to that of FIG. 18F. However, in this case, the levels may be interleaved so that the fingers of alternating electrical nodes also alternate in their directions.

Figure 18H:
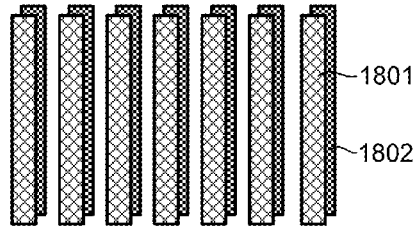

FIG. 18H shows a plan view of another example of a sense capacitor 102, similar to that of FIG. 18D. In this case, the fingers of element 1801 are electrically isolated from each other, and the fingers of element 1802 are also electrically isolated from each other. Thus, this example may allow for locational and/or directional determination of environmental factors, in a manner similar to that described with regard to FIG. 17.

Figure 18J:
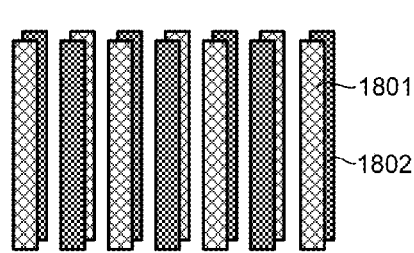

FIG. 18J shows a plan view of another example of a sense capacitor 102, similar to that of FIG. 18H. However, in this example, the fingers at a given level alternate. For example, at the upper level as shown in FIG. 18H, the fingers would be as follows: 1801, 1802, 1801, 1802, etc. Also, in this example, the fingers of elements 1801 and 1802 are all electrically isolated from each other. Thus, this example may also allow for locational and/or directional determination of environmental factors, in a manner similar to that described with regard to FIG. 17.

Figure 18K:
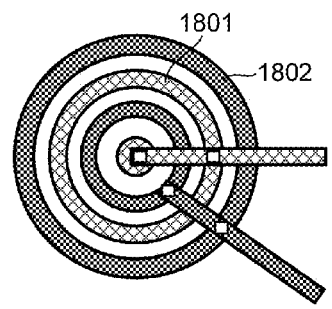

FIG. 18K is a plan view of another example of a sense capacitor 102. In this example, the elements 1801 and 1802 are arranged as concentric circular rings. For each of the elements 1801, 1802, the rings are electrically tied together.

Figure 18L:
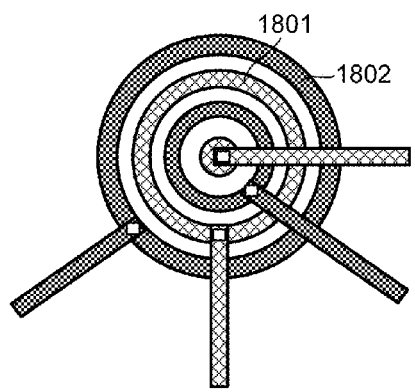

FIG. 18L is a plan view of another example of a sense capacitor 102, similar to that of FIG. 18K. However, in this example, each of the rings are electrically isolated from each other. Thus, this example may also allow for locational and/or directional determination of environmental factors, in a manner similar to that described with regard to FIG. 17.

The previously-described configurations of sense capacitors 102 are merely examples—there are many more configurations that are possible. For example, sense capacitors 102 may be provided that are of any shape (e.g., any polygon, any regular shape, any irregular shape) and that have any configuration and shapes of electrical elements. Moreover, the dielectric material between the elements may be any dielectric material desired. The dielectric material may be made of any dielectric material, such as Si-oxide, Si-nitride, any low-k dielectric, any high-k dielectric material, any dense dielectric, any porous dielectric, or any combination thereof. In addition, while various descriptions of where sense capacitors 102 may be placed within a chip have been provided, these are also merely examples. One or more sense capacitors 102, of any configuration, maybe placed anywhere within a chip as desired. In addition, while a particular shape of the chip 101 has been shown in the figures, the chip 101 may be of any shape, such as square, rectangular, or any other shape. The chip 101 may also be part of any type of semiconductor chip package and may be electrically and/or physically connectable to become part of a larger device in any way desired. Moreover, while particular capacitances of the sense capacitors 102 have been described, these are also merely examples. The sense capacitors 102 may have any values of capacitance as desired, and may be of any size as desired.

Therefore, at least the following features have been disclosed:

1. A circuit, comprising:
    a first transistor having a gate, and further having a current path (e.g. a source/drain current path, i.e. a current path between source and drain) controlled by the gate of the first transistor and coupled between a first input node and a first node of a capacitor;
    a second transistor having a gate, and further having a current path (e.g. a source/drain current path) controlled by the gate of the second transistor and coupled between a second input node and the first node of the capacitor;
    a third transistor having a gate, and further having a current path (e.g. a source/drain current path) controlled by the gate of the third transistor and coupled between a third input node and a second node of the capacitor; and
    a fourth transistor having a gate, and further having a current path (e.g. a source/drain current path) controlled by the gate of the fourth transistor and coupled between a fourth input node and the second node of the capacitor,
    wherein the first and second transistors are either all n-type transistors or all p-type transistors and the third and fourth transistors are either all n-type transistors or all p-type transistors.
2. The circuit as described in "1," wherein each of the first, second, third, and fourth transistors comprises an NMOS transistor.
3. The circuit as described in "1" or "2," further comprising a signal generator configured to generate a first periodic signal and a second periodic signal, and to supply the gates of the first and third transistors with the first periodic signal and the second and fourth transistors with the second periodic signal, wherein the first and second periodic signals are out of phase with each other by 180 degrees.
4. The circuit as described in "3," wherein the first and second periodic signals are sinusoidal signals.
5. The circuit as described in "1," "2," or "3," further comprising a direct current (DC) voltage generator configured to apply a first DC voltage across the first and second input nodes and a second DC voltage across the third and fourth nodes.

6. The circuit as described in "5," wherein the DC voltage generator is further configured to apply, over time, the following four permutations of the first and second DC voltages, in no particular order:
  a first permutation in which the first DC voltage is +X volts while the second DC voltage is +X volts;
  a second permutation in which the first DC voltage is +X volts while the second DC voltage is −X volts;
  a third permutation in which the first DC voltage is −X volts while the second DC voltage is −X volts; and
  a fourth permutation in which the first DC voltage is −X volts while the second DC voltage is +X volts,
  wherein X is a positive value.
7. The circuit as described in "6," further comprising:
  at least one current measurement device configured to measure currents through the first, second, third, and fourth DC input nodes while the four permutations of the first and second DC voltages are applied; and
  a controller configured to determine a value based on a combination of the measured currents.
8. The circuit as described in any of "1" through "7," wherein the first, second, third, and fourth transistors are all n-type transistors.
9. The circuit as described in any of "1" through "7," wherein the first, second, third, and fourth transistors are all p-type transistors.
10. A method, comprising:
  applying a first periodic signal to a first node of a circuit and a second periodic signal to a second node of the circuit, wherein the first and second periodic signals are out of phase with each other by 180 degrees, and wherein a capacitor is coupled to the circuit;
  while the first and second periodic signals are being applied, applying a first DC voltage across third and fourth nodes of the circuit and a second DC voltage across fifth and sixth nodes of the circuit;
  measuring currents through the third, fourth, fifth, and sixth nodes while the first and second DC voltages are being applied; and
  determining, based on the measured currents, a value proportional to a capacitance of the capacitor.
11. The method as described in "10," wherein said applying the first and second DC voltages comprises applying, over time, the following four permutations of the first and second DC voltages, in no particular order:
  a first permutation in which the first DC voltage is +X volts while the second DC voltage is +X volts;
  a second permutation in which the first DC voltage is +X volts while the second DC voltage is −X volts;
  a third permutation in which the first DC voltage is −X volts while the second DC voltage is −X volts; and
  a fourth permutation in which the first DC voltage is −X volts while the second DC voltage is +X volts,
  wherein X is a positive value.
12. The method as described in "11," wherein said measuring comprises measuring the currents during each of the four permutations, and wherein said determining comprises:
  for each of the four permutations, summing the currents measured during the respective permutation, to result in a first summed current for the first permutation, a second summed current for the second permutation, a third summed current for the third permutation, and a fourth summed current for the fourth permutation; and
  determining a value proportional to the capacitance of the capacitor based on a combination of the first, second, third, and fourth summed currents.
13. The method as described in "12," wherein the combination comprises the first summed current minus the second summed current plus the third summed current minus the fourth summed current.
14. The method as described in any of "10" through "13," wherein the circuit comprises first, second, third, and fourth transistors, the first node is coupled to a gate of the first transistor and a gate of the third transistor, the second node is coupled to a gate of the second transistor and a gate of the fourth transistor, and the capacitor has a first electrode coupled to a node between current paths of the first and second transistors and a second electrode coupled to a node between current paths of the third and fourth transistors.
15. The method as described in "14," wherein the first, second, third, and fourth transistors are either all n-type transistors or all p-type transistors.
16. A semiconductor chip comprising:
  a substrate;
  a plurality of layers of material disposed on the substrate;
  an active area of the semiconductor chip within which a plurality of circuit elements are disposed in at least some of the layers; and
  a capacitor disposed in a keep-out area of the semiconductor chip and electrically coupled to at least one of the circuit elements.
17. The semiconductor chip as described in "16," wherein the capacitor has a capacitance of less than 50 atto-Farads.
18. The semiconductor chip as described in "16" or "17," wherein the capacitor is disposed in one or more of the layers.
19. The semiconductor chip as described in any of "16" through "18," wherein the circuit elements comprise a controller configured to determine a value based on a capacitance of the capacitor.
20. The semiconductor chip as described in "19," wherein the circuit elements further comprise a memory coupled to the controller, wherein the controller is configured to store a history of values of the determined value in the memory.
21. The semiconductor chip as described in "19" or "20," wherein the controller is further configured to generate an early warning signal based on the determined value.
22. The semiconductor chip as described in any of "16" through "21," further comprising a crackstop structure, wherein the capacitor is disposed between an edge of the semiconductor chip and the crackstop structure.
23. The semiconductor chip as described in any of "16" through "21," further comprising a crackstop structure and a seal ring disposed around the active area, wherein the capacitor is disposed between an inner side of the seal ring and the crackstop structure.
24. The semiconductor chip as described in any of "16" through "22," further comprising a pair of seal rings disposed around the active area, wherein the capacitor is disposed between the pair of seal rings.
25. The semiconductor chip as described in any of "16" through "22," further comprising a seal ring disposed around the active area, wherein the capacitor is disposed between an outer side of the seal ring and an edge of the chip.

26. The semiconductor chip as described in any of "16" through "25," wherein the capacitor comprises a plurality of electrodes spatially distributed such that the capacitor has a plurality of capacitances at different locations in the capacitor, and wherein the at least one of the circuit elements is configured to determine, for each of the plurality of capacitances, a value based on the respective capacitance.

27. A semiconductor chip comprising:
a substrate;
a plurality of layers of material disposed on the substrate;
an active area of the semiconductor chip within which a plurality of circuit elements are disposed in at least some of the layers;
a first seal ring disposed in at least some of the layers and surrounding the active area; and
a capacitor disposed between an outer side of the seal ring and an edge of the semiconductor chip, wherein the capacitor is electrically coupled to at least one of the circuit elements.

28. The semiconductor chip as described in "27," further comprising a second seal ring disposed in at least some of the layers and surrounding the first seal ring, wherein the capacitor is disposed between the first and second seal rings.

29. A semiconductor chip comprising:
a substrate;
a plurality of layers of material disposed on the substrate;
a capacitor disposed in one or more of the layers and having a capacitance of less than 50 atto-Farads (aF);
a circuit electrically coupled to the capacitor and configured to determine a value based on a capacitance of the capacitor to an accuracy of 5 aF or less, and to generate a signal based on the determined value.

30. The semiconductor chip as described in "29," wherein the capacitor is disposed in a keep-out area of the semiconductor chip and the circuit is disposed in an active area of the chip.

31. The semiconductor chip as described in "29" or "30," further comprising a crackstop structure, wherein the capacitor is disposed between the crackstop structure and an edge of the semiconductor chip.

32. The semiconductor chip as described in "29" or "30," further comprising a crackstop structure and a seal ring, wherein the capacitor is disposed between the crackstop structure and the seal ring.

While various embodiments have been illustrated and described, there are merely examples. The words used in this specification are words of description rather than limitation, and it is understood that various changes may be made without departing from the spirit and scope of the present disclosure.

The invention claimed is:

1. A circuit, comprising:
a first transistor having a gate, and further having a current path controlled by the gate of the first transistor and coupled between a first input node and a first node of a capacitor;
a second transistor having a gate, and further having a current path controlled by the gate of the second transistor and coupled between a second input node and the first node of the capacitor;
a third transistor having a gate, and further having a current path controlled by the gate of the third transistor and coupled between a third input node and a second node of the capacitor;
a fourth transistor having a gate, and further having a current path controlled by the gate of the fourth transistor and coupled between a fourth input node and the second node of the capacitor; and
a signal generator configured to generate a first periodic signal and a second periodic signal, and to supply the gates of the first and third transistors with the first periodic signal and the second and fourth transistors with the second periodic signal, wherein the first and second periodic signals are out of phase with each other by 180 degrees,
wherein the first and second transistors are either all n-type transistors or all p-type transistors and the third and fourth transistors are either all n-type transistors or all p-type transistors.

2. The circuit of claim 1, wherein the first and second periodic signals are sinusoidal signals.

3. The circuit of claim 1, further comprising a direct current (DC) voltage generator configured to apply a first DC voltage across the first and second input nodes and a second DC voltage across the third and fourth nodes.

4. The circuit of claim 3, wherein the DC voltage generator is further configured to apply, over time, the following four permutations of the first and second DC voltages, in no particular order:
a first permutation in which the first DC voltage is +X volts while the second DC voltage is +X volts;
a second permutation in which the first DC voltage is +X volts while the second DC voltage is −X volts;
a third permutation in which the first DC voltage is −X volts while the second DC voltage is −X volts; and
a fourth permutation in which the first DC voltage is −X volts while the second DC voltage is +X volts,
wherein X is a positive value.

5. The circuit of claim 4, further comprising:
at least one current measurement device configured to measure currents through the first, second, third, and fourth DC input nodes while the four permutations of the first and second DC voltages are applied; and
a controller configured to determine a value based on a combination of the measured currents.

6. The circuit of claim 1, wherein the first, second, third, and fourth transistors are all n-type transistors.

7. The circuit of claim 6, wherein each of the first, second, third, and fourth transistors comprises an NMOS transistor.

8. The circuit of claim 1, wherein the first, second, third, and fourth transistors are all p-type transistors.

9. A semiconductor chip comprising:
a substrate;
a plurality of layers of material disposed on the substrate;
an active area of the semiconductor chip within which a plurality of circuit elements are disposed in at least some of the layers; and
a capacitor disposed in a keep-out area of the semiconductor chip and electrically coupled to at least one of the circuit elements,
wherein the circuit elements comprise a controller configured to determine a value based on a capacitance of the capacitor and wherein the controller is further configured to generate an early warning signal based on the determined value.

10. The semiconductor chip of claim 9, wherein the capacitor has a capacitance of less than 50 atto-Farads.

11. The semiconductor chip of claim 9, wherein the capacitor is disposed in one or more of the layers.

12. The semiconductor chip of claim 9, wherein the circuit elements further comprise a memory coupled to the controller, wherein the controller is configured to store a history of values of the determined value in the memory.

13. The semiconductor chip of claim 9, further comprising a crackstop structure, wherein the capacitor is disposed between an edge of the semiconductor chip and the crackstop structure.

14. The semiconductor chip of claim 9, further comprising a crackstop structure and a seal ring disposed around the active area, wherein the capacitor is disposed between an inner side of the seal ring and the crackstop structure.

15. The semiconductor chip of claim 9, further comprising a pair of seal rings disposed around the active area, wherein the capacitor is disposed between the pair of seal rings.

16. The semiconductor chip of claim 9, further comprising a seal ring disposed around the active area, wherein the capacitor is disposed between an outer side of the seal ring and an edge of the chip.

17. The semiconductor chip of claim 9, wherein the capacitor comprises a plurality of electrodes spatially distributed such that the capacitor has a plurality of capacitances at different locations in the capacitor, and wherein the at least one of the circuit elements is configured to determine, for each of the plurality of capacitances, a value based on the respective capacitance.

18. A semiconductor chip comprising:
   a substrate;
   a plurality of layers of material disposed on the substrate;
   a capacitor disposed in one or more of the layers and having a capacitance of less than 50 atto-Farads (aF);
   a circuit electrically coupled to the capacitor and configured to determine a value based on a capacitance of the capacitor to an accuracy of 5 aF or less, and to generate an early warning signal based on the determined value.

19. The semiconductor chip of claim 18, wherein the capacitor is disposed in a keep-out area of the semiconductor chip and the circuit is disposed in an active area of the chip.

20. The semiconductor chip of claim 18, further comprising a crackstop structure, wherein the capacitor is disposed between the crackstop structure and an edge of the semiconductor chip.

21. The semiconductor chip of claim 18, further comprising a crackstop structure and a seal ring, wherein the capacitor is disposed between the crackstop structure and the seal ring.

* * * * *